United States Patent
Yang et al.

(10) Patent No.: US 10,868,161 B2
(45) Date of Patent: Dec. 15, 2020

(54) LOW RESISTANCE SOURCE/DRAIN REGIONS IN III-V TRANSISTORS

(71) Applicant: QUALCOMM Incorporated, San Diego, CA (US)

(72) Inventors: Bin Yang, San Diego, CA (US); Gengming Tao, San Diego, CA (US); Xia Li, San Diego, CA (US)

(73) Assignee: QUALCOMM Incorporated, SanDiego, CA (US)

( * ) Notice: Subject to any disclaimer, the term of this patent is extended or adjusted under 35 U.S.C. 154(b) by 0 days.

(21) Appl. No.: 16/116,685

(22) Filed: Aug. 29, 2018

(65) Prior Publication Data

US 2020/0075753 A1    Mar. 5, 2020

(51) Int. Cl.
| | |
|---|---|
| H01L 29/778 | (2006.01) |
| H01L 21/768 | (2006.01) |
| H01L 29/08 | (2006.01) |
| H01L 29/20 | (2006.01) |
| H01L 29/205 | (2006.01) |
| H01L 29/66 | (2006.01) |
| H01L 27/06 | (2006.01) |

(52) U.S. Cl.
CPC ...... *H01L 29/778* (2013.01); *H01L 21/76832* (2013.01); *H01L 29/0847* (2013.01); *H01L 29/2003* (2013.01); *H01L 29/205* (2013.01); *H01L 29/66462* (2013.01); *H01L 29/66545* (2013.01); *H01L 27/0605* (2013.01)

(58) Field of Classification Search
None
See application file for complete search history.

(56) References Cited

U.S. PATENT DOCUMENTS

| | | | |
|---|---|---|---|
| 7,842,972 B2 | 11/2010 | Nichols et al. | |
| 8,119,488 B2 | 2/2012 | Hellings et al. | |
| 8,455,860 B2 | 6/2013 | Ko et al. | |
| 8,574,929 B1 | 11/2013 | Or-Bach et al. | |
| 9,059,123 B2 | 6/2015 | Hekmatshoartabari et al. | |

(Continued)

OTHER PUBLICATIONS

International Search Report and Written Opinion for International Patent Application No. PCT/US2019/043561, dated Nov. 5, 2019, 16 pages.

(Continued)

*Primary Examiner* — Anthony Ho
*Assistant Examiner* — Kevin Quinto
(74) *Attorney, Agent, or Firm* — Withrow & Terranova, PLLC

(57) ABSTRACT

Low resistance source/drain regions in III-V transistors are disclosed. More particularly, a source and a drain are formed from heavily doped III-V materials that have lower resistances than a barrier layer and/or a cap layer under the drain. In an exemplary aspect, the barrier and cap layers are formed over a mobility channel layer and then etched to form source and drain recesses. A source and a drain are then epitaxially grown in the recesses. The source and the drain may include one or more layers, with the top layer having the lowest bandgap, thus helping to lower contact resistance. By lowering the resistance of the source and the drain, the overall resistance of the transistor may be lowered to allow for operation at higher frequencies.

10 Claims, 21 Drawing Sheets

(56) References Cited

U.S. PATENT DOCUMENTS 9,984,929 B1* 5/2018 Czornomaz ....... H01L 29/66772
2014/0091308 A1* 4/2014 Dasgupta ............ H01L 29/7784
257/76

OTHER PUBLICATIONS

Tongde H., et al., "DC and RF Performance of Gate-Last AlN /GaN MOSHEMTs on Si With Regrown Source/Drain," IEEE Transactions on Electron Devices, vol. 60, No. 10, Oct. 2013, IEEE, pp. 3019-3024.

* cited by examiner

LOW RESISTANCE SOURCE/DRAIN REGIONS IN III-V TRANSISTORS

BACKGROUND

I. Field of the Disclosure

The technology of the disclosure relates generally to transistors and, more particularly, to III-V high electron mobility transistors (HEMTs).

II. Background

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory cells. Radio communication devices also employ transistors for amplifying and otherwise conditioning signals.

While bipolar junction transistors (BJTs) are common in certain applications, Field-Effect Transistors (FETs) are more commonly used in ICs. A FET is a three-terminal device having a source, a drain, and a gate over a substrate. The substrate includes a channel region between the source region and the drain region. When a high voltage is applied at the gate, and voltage is low at the source, an electric field is generated that penetrates the channel region. If the voltage is also high at the drain, a current can flow from the drain to the source, in effect, turning the transistor on. When the gate voltage is low, the electric field is small, and the channel is off.

Early transistors used in ICs were made primarily from semiconductors such as Silicon (Si) and Germanium (Ge). Moore's Law has suggested that the number of transistors in a dense IC doubles about every two years. This doubling is, in part, a function of reductions in the size of transistors. In 2012, a node size for transistors was typically around twenty-two nanometers (22 nm) for Silicon-based transistors. As of this writing, node sizes are now below fourteen (14) nm for Silicon-based transistors. The physical properties of such transistors impose some operating constraints on power levels and operating frequencies. For many years, such constraints were tolerated as the constraints did not affect planned operations. However, industry pressures to increase operating frequencies and power levels have caused explorations into alternate materials which may support such elevated operating levels.

III-V transistors have been advanced to fill this need. III-V transistors are called III-V for the placement of the component elements on the periodic table. That is, an element from the III-A column (e.g., Aluminum (Al), Gallium (Ga), or Indium (In)) and an element from the V-A column (e.g., Nitrogen (N), Phosphorous (P), or Arsenic (As)) are combined to form a semiconductor (e.g., GaAs, GaN, or the like). Devices made from III-V materials are generally larger than Silicon-based transistors. The size and operating attributes initially led to the use of III-V transistors in the radio frequency transceiver portions of computing devices where power levels may be high and size pressures were not as critical, but industry pressures for elevated power levels in the application processor are causing III-V devices to be included in locations other than the radio frequency transceivers.

In addition to the general pressure to handle elevated power levels and reduce the size of transistors in application processors and similar elements, III-V transistors are being faced with demands to operate at frequencies at or above one hundred gigahertz (100 GHz). For example, applications that have operating frequencies above 100 GHz can include imaging and sensing devices where receiver sensitivity is determined primarily by noise performance of a front-end low noise amplifier.

It should be appreciated that the operating frequency of III-V transistors is based on the resistance of the transistor. The resistance of the transistor is a function of the resistance of the source, the drain, and the channel. At low frequencies, the resistance of the channel is much larger than the resistances of the source or the drain. Thus, below 100 GHz, the resistance is generally a linear function of the channel resistance, and the operating frequency is thus generally linearly proportional to the inverse of the channel length (sometimes referred to as Lg). However, at frequencies above 100 GHz, the resistance of the channel is no longer large relative to the resistance of the source and drain, and further reductions in the channel length do not provide the same increases in operating frequencies.

Thus, given that there is a need to allow III-V transistors to operate at frequencies above 100 GHz, there is a need to find a way to construct a III-V transistor that can meet that operational requirement.

SUMMARY OF THE DISCLOSURE

Aspects disclosed in the detailed description include low resistance source/drain regions in III-V transistors. More particularly, a source and a drain are formed from heavily doped III-V materials that have lower resistances than a barrier layer and/or a cap layer under the drain. In an exemplary aspect, the barrier and cap layers are formed over a mobility channel layer and then etched to form source and drain recesses. A source and a drain are then epitaxially grown in the recesses. The source and the drain may include one or more layers, with the top layer having the lowest bandgap, thus helping to lower contact resistance. By lowering the resistance of the source and the drain, the overall resistance of the transistor may be lowered to allow for operation at higher frequencies.

In this regard in one aspect, a transistor is disclosed. The transistor includes a substrate having a horizontal axis and a vertical axis. The transistor also includes a mobility channel layer positioned above the substrate on the vertical axis. The transistor also includes a barrier layer positioned above the mobility channel layer on the vertical axis. The barrier layer includes a barrier structure. The barrier structure includes a first side and a second side. The second side faces opposite the first side along the horizontal axis. A shared junction between the barrier layer and the mobility channel layer forms a channel. The transistor also includes a source positioned horizontally adjacent to the first side of the barrier structure. The source includes a first III-V material. The transistor also includes a drain positioned horizontally adjacent to the second side of the barrier structure. The drain includes a second III-V material. The transistor also includes a gate positioned above the barrier structure.

In another aspect, a method of fabricating a transistor is disclosed. The method includes forming a substrate having a horizontal axis and a vertical axis. The method also includes positioning a mobility channel layer above the substrate on the vertical axis. The method also includes forming a barrier layer on the mobility channel layer such that a junction between the barrier layer and the mobility channel layer forms a channel. The method also includes etching a first recess in the barrier layer. The method also includes forming a source using a first III-V material in the first recess. The method also includes etching a second recess in the barrier layer. The method also includes forming a drain using the first III-V material in the second recess. The method also includes positioning a gate above the barrier layer between the first recess and the second recess.

In another aspect, a transistor is disclosed. The transistor includes a substrate having a horizontal axis and a vertical axis. The transistor also includes a means for providing a channel. The means for providing the channel includes at least a barrier structure positioned above the substrate on the vertical axis. The transistor also includes the barrier structure including a first side and a second side. The second side faces opposite the first side along the horizontal axis. The transistor also includes a means for holding a source positioned horizontally adjacent to the first side of the barrier structure. The source includes a first III-V material. The transistor also includes a means for holding a drain positioned horizontally adjacent to the second side of the barrier structure. The drain includes a second III-V material. The transistor also includes a gate positioned above the barrier structure.

In another aspect, a transistor is disclosed. The transistor includes a substrate. The transistor also includes an undoped III-V material mobility channel layer. The transistor also includes an undoped barrier layer positioned on top of the undoped III-V material mobility channel layer such that a junction therebetween forms a channel for the transistor. The undoped barrier layer delimits a source recess and a drain recess separated by the channel. The transistor also includes a gate positioned over the channel and separated from the channel by at least the undoped barrier layer. The transistor also includes a source positioned in the source recess. The source includes a doped III-V material. The transistor also includes a drain positioned in the drain recess. The drain includes a doped III-V material.

DETAILED DESCRIPTION

Figure 1A:
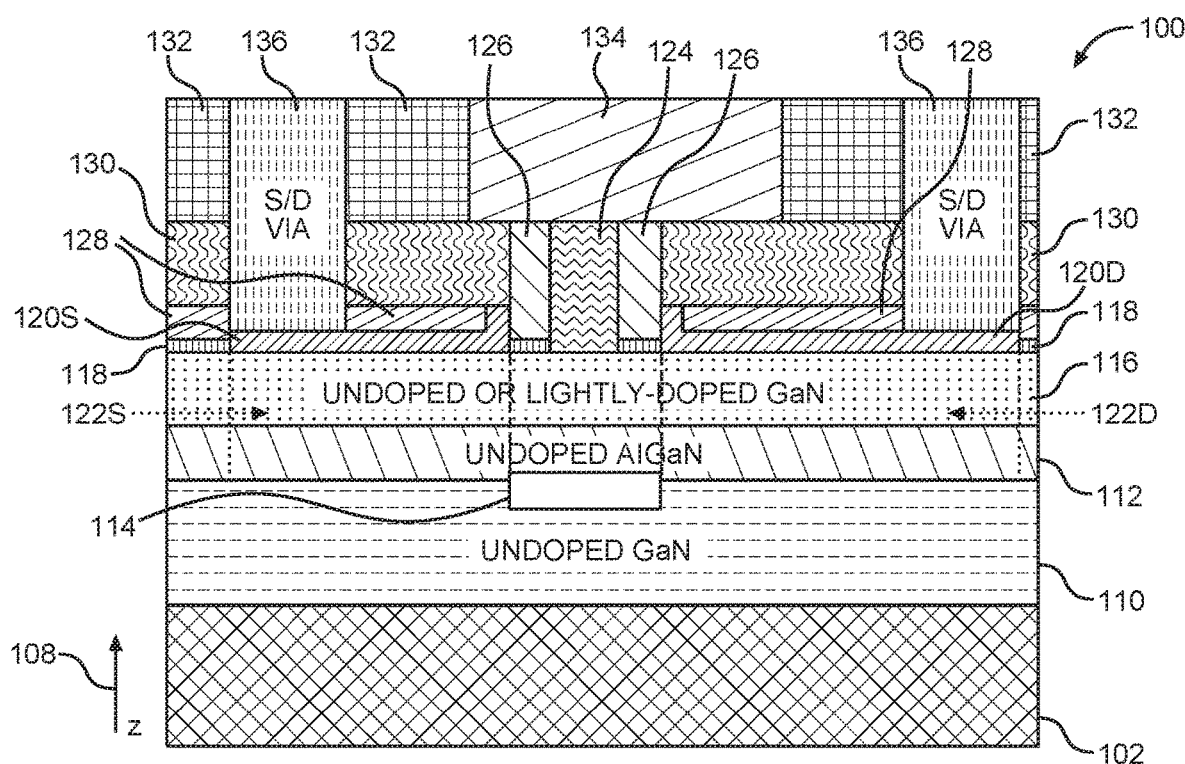
FIG. 1A is a cross-sectional elevational view of a conventional electron mobility transistor (HEMT) with a high resistance source and drain.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include low resistance source/drain regions in III-V transistors. More particularly, a source and a drain are formed from heavily doped III-V materials that have lower resistances than a barrier layer and/or a cap layer under the drain. In an exemplary aspect, the barrier and cap layers are formed over a mobility channel layer and then etched to form source and drain recesses. A source and a drain are then epitaxially grown in the recesses. The source and the drain may include one or more layers, with the top layer having the lowest bandgap, thus helping to lower contact resistance. By lowering the resistance of the source and the drain, the overall resistance of the transistor may be lowered to allow for operation at higher frequencies.

While exemplary aspects of the present disclosure may be applied to all III-V transistors, the present disclosure is well suited for use with metal semiconductor (MES) Field-Effect Transistors (FETs) (MESFETs) and variations such as a high electron mobility transistor (HEMT) type of III-V transistor. MESFETs differ from traditional metal oxide semiconductor (MOS) FETs (MOSFETs) in that instead of a traditional p-n junction for a gate, a Schottky (metal-semiconductor) junction is used. That is, there is no insulator under the gate over the active switching region. Aspects of the present disclosure are also applicable to metamorphic HEMTs (mHEMTs) and pseudomorphic HEMTs (pHEMTs).

Figure 1B:
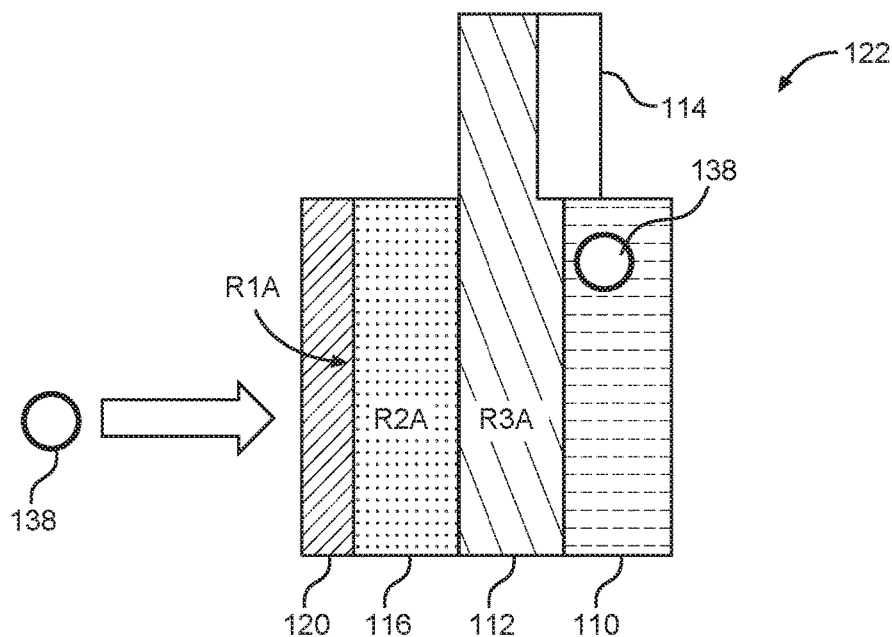
FIG. 1B is a simplified representation of resistance sources of the source/drain of the HEMT of FIG. 1A.

Before addressing particular details about the reduced resistance source/drain regions in III-V transistors of the present disclosure, a brief overview of a conventional III-V transistor is provided with reference to FIGS. 1A and 1B to help understanding of the operation of a transistor and appreciation of from where the resistance in the source/drain regions arises. Against this background, a discussion of exemplary aspects of the present disclosure is provided below beginning with reference to FIG. 2A.

In this regard, FIG. 1A is a cross-sectional elevational view of a transistor 100. The transistor 100 is an HEMT III-V transistor. In particular, the transistor 100 includes a substrate 102, which may be Silicon (Si) or other semiconductor substrate. For ease of reference, the substrate 102 may define a primary horizontal x-axis 104, a secondary y-axis 106 (into/out of the page) and a vertical z-axis 108. A mobility channel layer 110 is positioned on top of in the z-direction) the substrate 102. In an exemplary aspect, the mobility channel layer 110 is an undoped layer of Gallium Nitride (GaN). The mobility channel layer 110 has a relatively low bandgap. As is understood, the energy difference between the highest occupied state of the valance band (i.e., the band of electron orbitals from which electrons can jump) and the lowest unoccupied state of the conduction band (i.e., the location to which the electrons jump) is called the bandgap and is indicative of the electrical conductivity of a material. Thus, the mobility channel layer 110 requires relatively little energy to push electrons into the conductance band.

A barrier layer 112 is positioned on top of (i.e., in the z-direction) the mobility channel layer 110. In an exemplary aspect, the barrier layer 112 is an undoped layer of Aluminum Gallium Nitride (AlGaN). The barrier layer 112 has a larger bandgap than the mobility channel layer 110. When placed on top of the mobility channel layer 110, a heterojunction (or heterostructure) is formed that acts as a channel 114 that extends horizontally (in the x-direction) between a source and a drain (discussed below). The electrons made available by the addition of Aluminum (Al) drop into the mobility channel layer 110 creating a two-dimensional electron gas (2DEG).

A cap layer 116 may be positioned on top of the barrier layer 112. In an exemplary aspect, the cap layer 116 may be an undoped, or lightly doped Gallium Nitride (GaN) layer. A dielectric layer 118 may be positioned on top of the cap layer 116. A source contact 120S and a drain contact 120D are also positioned on top of the cap layer 116. While not a separate material, a portion of the cap layer 116 and the barrier layer 112 act as a source 122S and a different portion of the cap layer 116 and the barrier layer 112 act as a drain 122D. Generically, the source contact 120S and the drain contact 120D are referred to herein as a source/drain (S/D in the drawings) contact 120 (see FIG. 1B), and the source 122S and the drain 122D are referred to as source/drain 122 because it should be understood that the transistor 100 is a symmetric device, and the source 122S and the drain 122D are structurally identical.

With continued reference to FIG. 1A, a gate 124 is also positioned on top of the cap layer 116. Collectively, the cap layer 116 and the barrier layer 112 act to prevent leakage from the gate 124. That is, the higher bandgap of the barrier layer 112 and/or the cap layer 116 act to prevent the leakage. This arrangement is in place of the traditional oxide layer that insulates a gate in a MOSFET. The gate 124 has spacers 126 to either side. An oxide 128 is positioned on top of the source/drain contacts 120. An additional dielectric layer 130 is positioned on top of the oxide 128. A further dielectric layer 132 is positioned over the additional dielectric layer 130. The further dielectric layer 132 has a t-gate 134 formed therein over the gate 124. Source/drain vias 136 extend through the dielectric layers 130 and 132 to the source/drain contacts 120. While "via" is a well understood term whose generally accepted definition is accurate to describe the structure 136, it should be appreciated that the term "via" may sometimes equivalently be an acronym for vertical interconnect access, which is equally applicable to the structure 136. The source/drain vias 136 operate to allow an electrical connection to be made from a middle end-of-the-line (MEOL or MOL) metal layer (not shown) to the source 122S and the drain 122D of the transistor 100. Likewise, the t-gate 134 allows an electrical connection to be made to the gate 124.

Turning now to FIG. 1B, by forming the source/drain 122 from the cap layer 116 and the barrier layer 112, a conventional HEMT, such as the transistor 100, incurs a resistance penalty. That is, the resistance of the source/drain 122 is a combination of a resistance R1A of the source/drain contact 120, a resistance R2A of the cap layer 116, and a resistance R3A of the barrier layer 112. As noted, the junction that forms the channel 114 has a very low resistance, and electrons 138 travel easily along the junction once the combined resistance is overcome.

When the "length" (i.e., the x-dimension) of the channel 114 is relatively long (e.g., greater than 0.1 micrometer (μm)), the total resistance of the transistor 100 is dominated by the resistance of the channel 114 (even though the per unit resistance of the channel 114 is low). However, when the length of the channel 114 is less than about 0.1 μm, the resistance of the source/drain 122 is no longer trivial and remains essentially fixed while the resistance of the channel 114 continues to decrease. The overall impact of decreased size is that the operating frequency does not increase linearly at channel lengths below 0.1 μm and, in fact, levels off at about 85 GHz. Given that there is industry pressure to operate at frequencies above 100 GHz, there is a need to lower the resistance of the transistor such that the operating frequency can be above 100 GHz.

Exemplary aspects of the present disclosure reduce the resistance of the source and drain by replacing the material used as the source and drain in the barrier layer and the cap layer with lower resistance material while preserving the barrier layer underneath the gate to keep the heterojunction intact. Preservation of the barrier layer under the gate allows formation of the channel and likewise acts as a barrier to prevent leakage from the gate. In an exemplary aspect, this replacement is done by etching the barrier layer and the cap layer to form recesses on either side of the gate, leaving a pillar or barrier structure to support the gate. The recesses are filled by epitaxially growing heavily doped, low bandgap material therein.

Figure 2A:
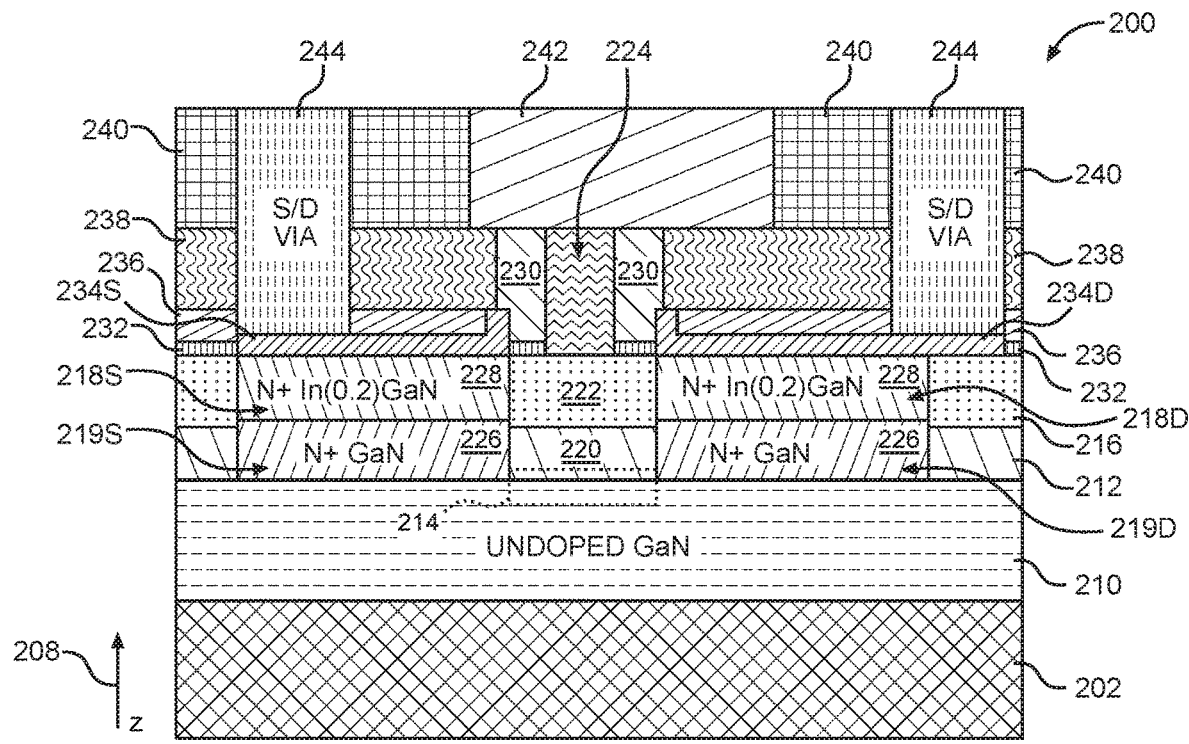
FIG. 2A is a cross-sectional elevational view of a HEMT with a lowered resistance source/drain according to an exemplary aspect of the present disclosure.

FIG. 2A illustrates a cross-sectional elevational view of an exemplary transistor 200 formed according to exemplary aspects of the present disclosure. In this regard, the transistor 200 is an HEMT III-V transistor. in particular, the transistor 200 includes a substrate 202, which may be Silicon (Si), Silicon Carbide (SiC), or other semiconductor substrate. Alternatively, the substrate may be an insulator such as sapphire. For ease of reference, the substrate 202 may define a primary horizontal x-axis 204, a secondary y-axis 206 (into/out of the page) and a vertical z-axis 208. A mobility channel layer 210 is positioned on top of (i.e., in the z-direction) the substrate 202. In an exemplary aspect, the mobility channel layer 210 is an undoped layer of Gallium Nitride (GaN). The mobility channel layer 210 has a relatively low bandgap. In an exemplary aspect, the mobility channel layer 210 may be between about 10 Angstroms (Å) and 100 Å thick (i.e., z-direction) with a doping level of generally less than E16 cm$^{-3}$ although light doping on the order of E17 cm$^{-3}$ may be used without departing from the scope of the present disclosure.

With continued reference to FIG. 2A, a barrier layer 212 is initially formed on top of (i.e., the z-direction) of the mobility channel layer 210. In an exemplary aspect, the barrier layer 212 is an undoped layer of Aluminum Gallium Nitride (AlGaN). The barrier layer 212 has a larger bandgap than the mobility channel layer 210. When placed on top of the mobility channel layer 210, a heterojunction (or heterostructure) is formed that acts as a channel 214 that extends horizontally (in the x-direction) between a source and a drain (discussed below). This heterojunction may also be referred to as a means for providing a channel. The electrons made available by the addition of Aluminum (Al) drop into the mobility channel layer 210 creating a two-dimensional electron gas (2DEG). In an exemplary aspect, the barrier layer 212 may be between about 10 Å and 200 Å thick with a doping level of generally less than E16 cm$^{-3}$.

A cap layer 216 may be positioned on top of the barrier layer 212. In an exemplary aspect, the cap layer 216 may be an undoped, or lightly doped Gallium Nitride (GaN) layer.

Unlike the transistor 100 of FIG. 1A, where the barrier layer 112 and the cap layer 116 extend the width (x-direction) of the transistor 100, in the transistor 200, the barrier layer 212 and the cap layer 216 are discontinuous with recesses 218S and 218D formed therein. The recesses 218S and 218D may also be referred to as a means for holding a source and a means for holding a drain, respectively. A source 219S is formed inside the recess 218S, and a drain 219D is formed inside the recess 218D. The barrier layer 212 thus may include a barrier structure 220 between the source 219S and the drain 219D. It should be appreciated that the barrier structure 220, along with a portion 222 of the cap layer 216 may be conceptualized as a pillar that supports a gate 224. In an exemplary aspect, the cap layer 216 may be between about 1 nanometer (nm) and 10 nm thick with a doping level of generally less than E16 cm$^{-3}$.

In an exemplary aspect, the source 219S and the drain 219D are formed from plural layers including a heavily N+ doped bottom layer 226 and a heavily N+ doped top layer 228. In an exemplary aspect, the base material for the bottom layer 226 is the same as the material for the mobility channel layer 210 (e.g., Gallium Nitride (GaN)). The bottom layer 226 may be about 10-200 Å thick with a doping on the order of greater than E18 cm$^{-3}$. The top layer 228 may be an Indium Gallium Nitride (InGaN) material. The bottom layer 226 may be about 10-100 Å thick with a doping layer on the order of greater than E18 cm$^{-3}$. The materials and doping for the bottom layer 226 and the top layer 228 are chosen to have a low bandgap (e.g., approximately 0.01 electron volt (eV) to 1 eV), which lowers the overall resistance of the source 219S and the drain 219D. While illustrated as having different thicknesses, it should be appreciated that the bottom layer 226 may be the same thickness as the barrier layer 212 and the top layer 228 may have the same thickness as the cap layer 216.

The structure above the source 219S and the drain 219D is similar to the corresponding structure in the transistor 100 of FIG. 1A. Thus, the gate 224 has spacers 230 to either side that sit on top of a first dielectric layer 232. A source contact 234S and a drain contact 234D sit on top of the source 219S and the drain 219D, respectively. An oxide 236 is positioned on top of the contacts 234S and 234D. An additional dielectric layer 238 is positioned on top of the oxide 236. A further dielectric layer 240 is positioned over the additional dielectric layer 238. The further dielectric layer 240 has a t-gate 242 formed therein over the gate 224. Source/drain vias 244 extend through the dielectric layers 238 and 240 to the source/drain contacts 234S and 234D. The source/drain vias 244 operate to allow an electrical connection to be made from an MEOL or MOL metal layer (not shown) to the source 219S and the drain 219D of the transistor 200. Likewise, the t-gate 242 allows an electrical connection to be made to the gate 224.

Figure 2B:
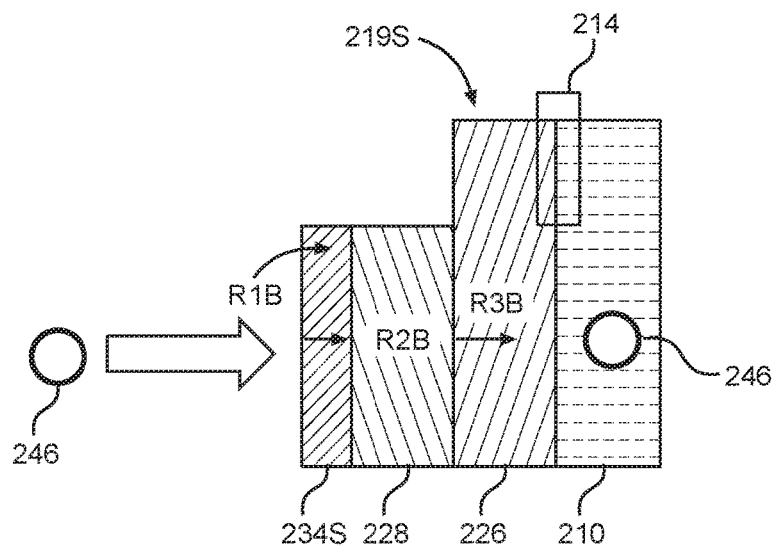
FIG. 2B is a simplified representation of resistance sources of the source/drain of the HEMT of FIG. 2A.

Turning now to FIG. 2B, by forming the source 219S and the drain 219D from the bottom layer 226 and the top layer 228, the resistances of the source 219S and the drain 219D are reduced relative to the source/drain of a conventional HEMT, such as the transistor 100 of FIG. 1A. That is, the resistance of the source 219S (for example, understanding that the drain 219D is essentially identical) is a combination of a resistance R1B of the source contact 234S, a resistance R2B of the top layer 228, and a resistance R3B of the bottom layer 226. Since the resistances R2B and R3B are less than the resistances R2A and R3A of the transistor 100, the net resistance is lowered relative to the transistor 100, and higher operating frequencies are possible. As noted, the junction that forms the channel 214 has a very low resistance and electrons 246 travel easily along the junction once the combined resistance is overcome.

To create the transistor 200, an exemplary aspect of the present disclosure etches the cap layer 216 and the barrier layer 212 to form the recesses 218S and 218D. The bottom layer 226 and the top layer 228 are then epitaxialty grown in the recesses 218S and 218D to form the source 219S and the drain 219D. A process 300 for fabricating the transistor 200 is set forth as a flowchart in FIGS. 3A and 3B with additional reference to FIGS. 4A-4S to illustrate individual steps of the process 300.

Figure 4A:
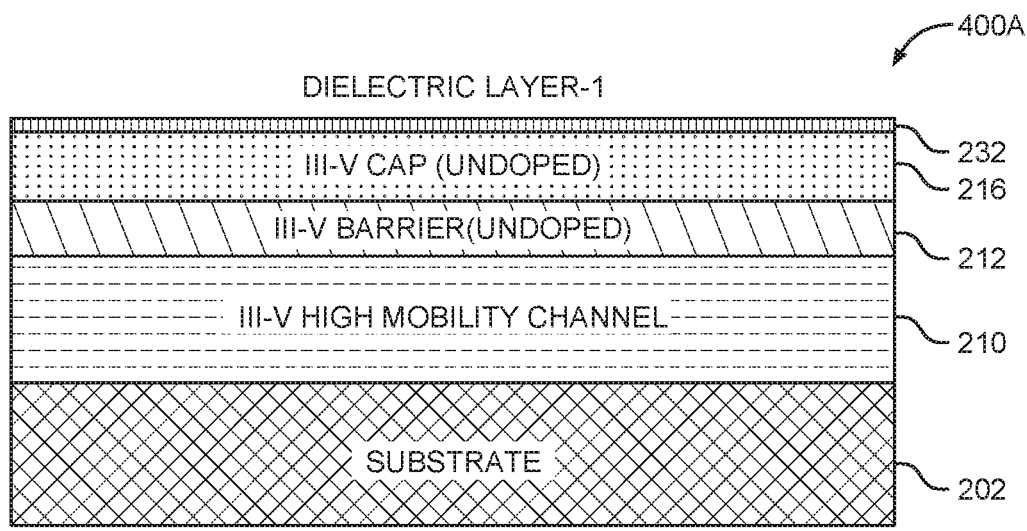
FIGS. 4A-4S are cross-sectional views of the fabrication steps of the process of FIGS. 3A and 3B in fabricating the HEMT of FIG. 2A.

In this regard, the process 300 begins by forming a substrate 202 (block 302, see generally partially formed product 400A in FIG. 4A). The substrate 202 may be a III-V material such as Gallium Arsenide (GaAs), Indium Phosphide (InP), Silicon Dioxide (SiO,), Aluminum Oxide (Al$_2$O$_3$), or the like. Alternatively, it can be Silicon (Si), Silicon Carbide (SiC), or other semiconductor material. As yet another alternative, the substrate 202 may be an insulator such as sapphire. With any material, the substrate 202 may be between about 500 μm and 1000 μm thick. On this substrate 202, a high mobility channel layer 210 is formed (block 304). Such formation may be through a deposition process or the like. As noted above, the mobility channel layer 210 may be a III-V material such as undoped. Gallium Nitride (GaN), Gallium Arsenide (GaAs), Indium Gallium Arsenide (InGaAs), Indium Phosphide (InP), or the like and the mobility channel layer 210 may have a thickness between 1 μm and 10 μm. The process 300 continues by forming a barrier layer 212 on the mobility channel layer 210 (block 306). The barrier layer 212 may be an undoped III-V material such as Aluminum Gallium Nitride (AlGaN), Aluminum Gallium Arsenide (AlGaAs), or the like and may have a thickness between 10 Å and 200 Å. The formation may be through a deposition process or the like. The process 300 continues by forming a cap layer 216 (block 308). The cap layer 216 may be an undoped III-V material such as Gallium Nitride (GaN), Gallium Arsenide (GaAs), Indium Phosphide (InP), or the like and may be between 10 Å and 100 Å thick. The formation may be through a deposition process or the like. The process 300 continues by forming a first dielectric layer 232 (block 310). The first dielectric layer 232 may be a material such as Silicon Dioxide (SiO$_2$) or Silicon Nitride (SiN) and may have a thickness of approximately 1-10 nanometers (nm). The formation may be through a deposition process or the like.

Figure 3A:
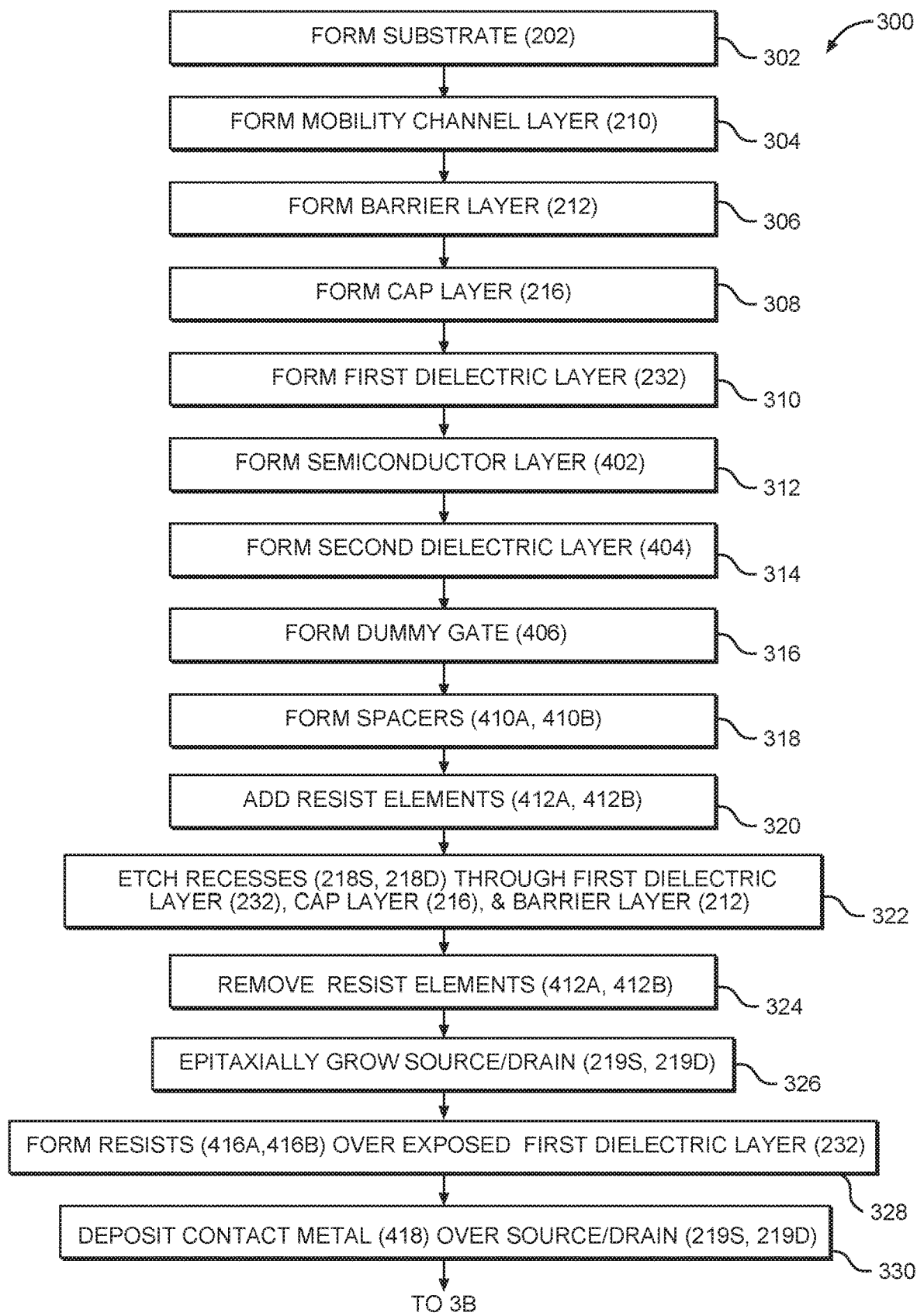
FIGS. 3A and 3B are a flowchart illustrating an exemplary process for fabricating the HEMT of FIG. 2A.
Figure 4B:
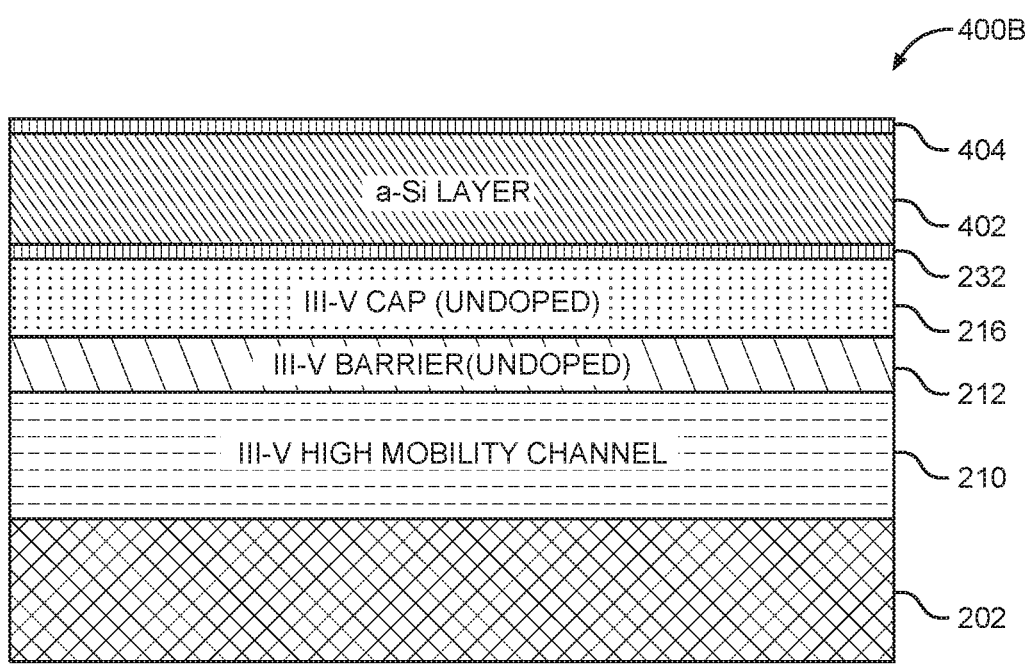

With continued reference to FIG. 3A and also to the partial product 400B of FIG. 4B, the process 300 continues by forming a semiconductor layer 402 on top of the first dielectric layer 232 (block 312). The semiconductor layer 402 may be an amorphous Silicon material and be between 10 nm and 100 nm thick. The semiconductor layer 402 may be formed through an amorphous Silicon deposition process or the like. Note that the semiconductor layer 402 is provided to help form a dummy gate whose use is explained in greater detail below. A second dielectric layer 404 is then formed on the silicon layer (block 314). The second dielectric layer 404 may also be a Silicon dioxide (SiO$_2$) or silicon nitride (SiN) layer and may be between 10 nm and 100 nm thick.

Figure 4C:
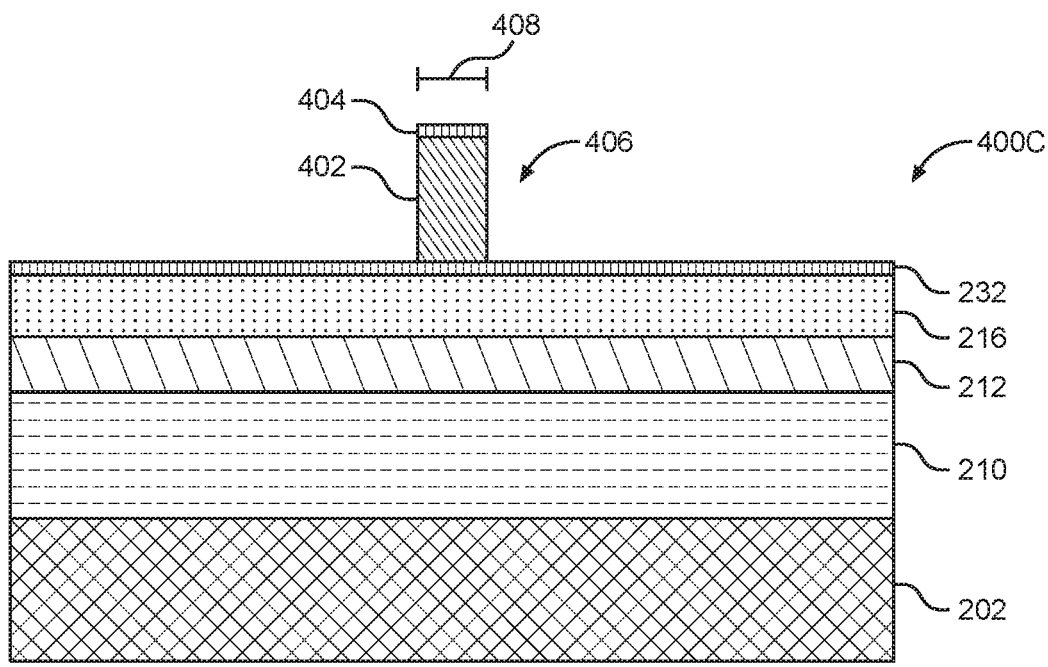

With continued reference to FIG. 3A and also to the partial product 400C of FIG. 4C, a dummy gate 406 is formed from the semiconductor layer 402 (block 316). The dummy gate 406 may be formed by etching after a lithographic process or the like, using the first dielectric layer 232 as an etch stop material. The width 408 of the dummy gate 406 in the x-axis direction may be between 10 nm and 100 nm. This width 408 will generally correspond to an eventual channel length Lg.

Figure 3B:
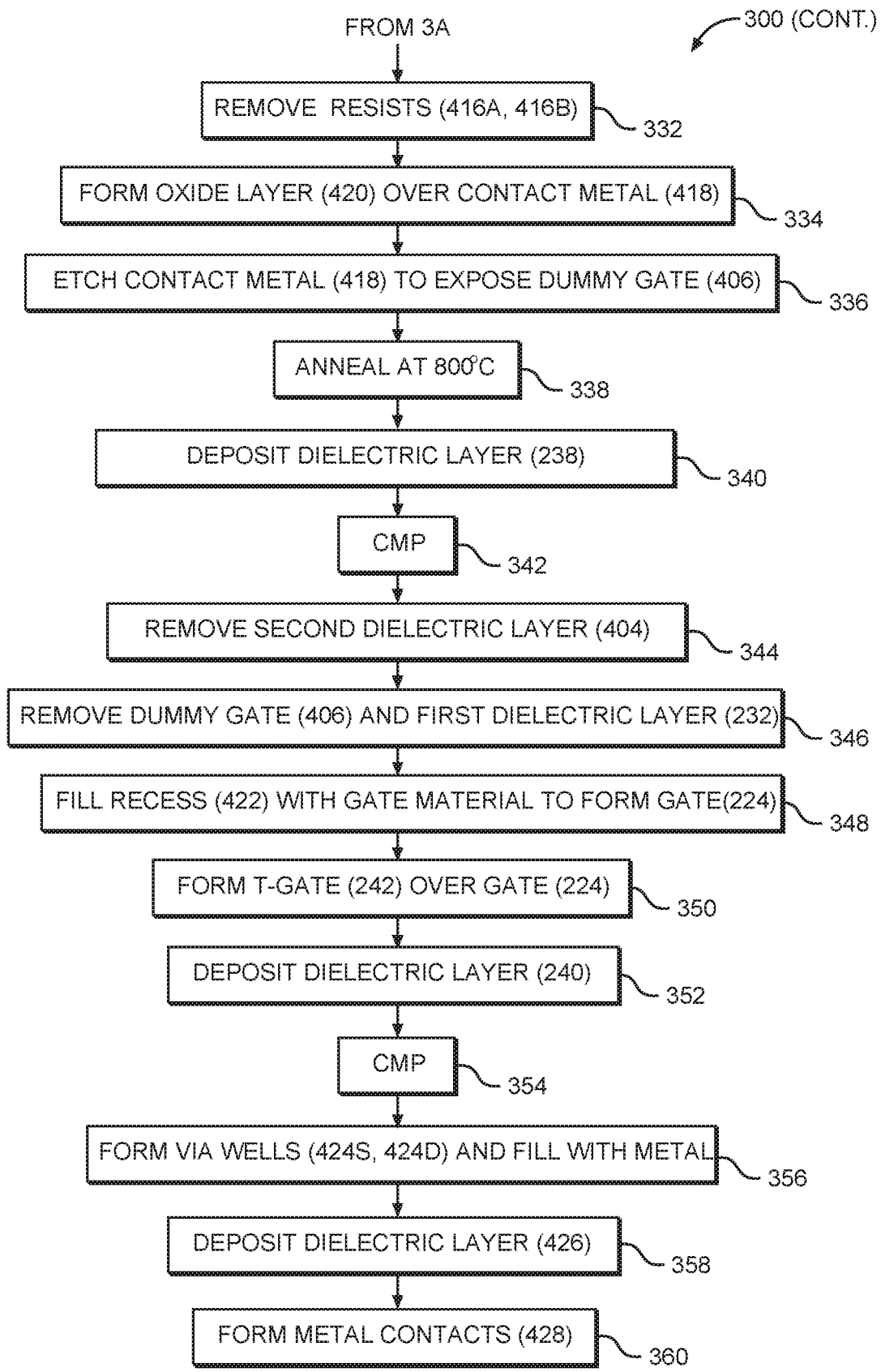
Figure 3C:
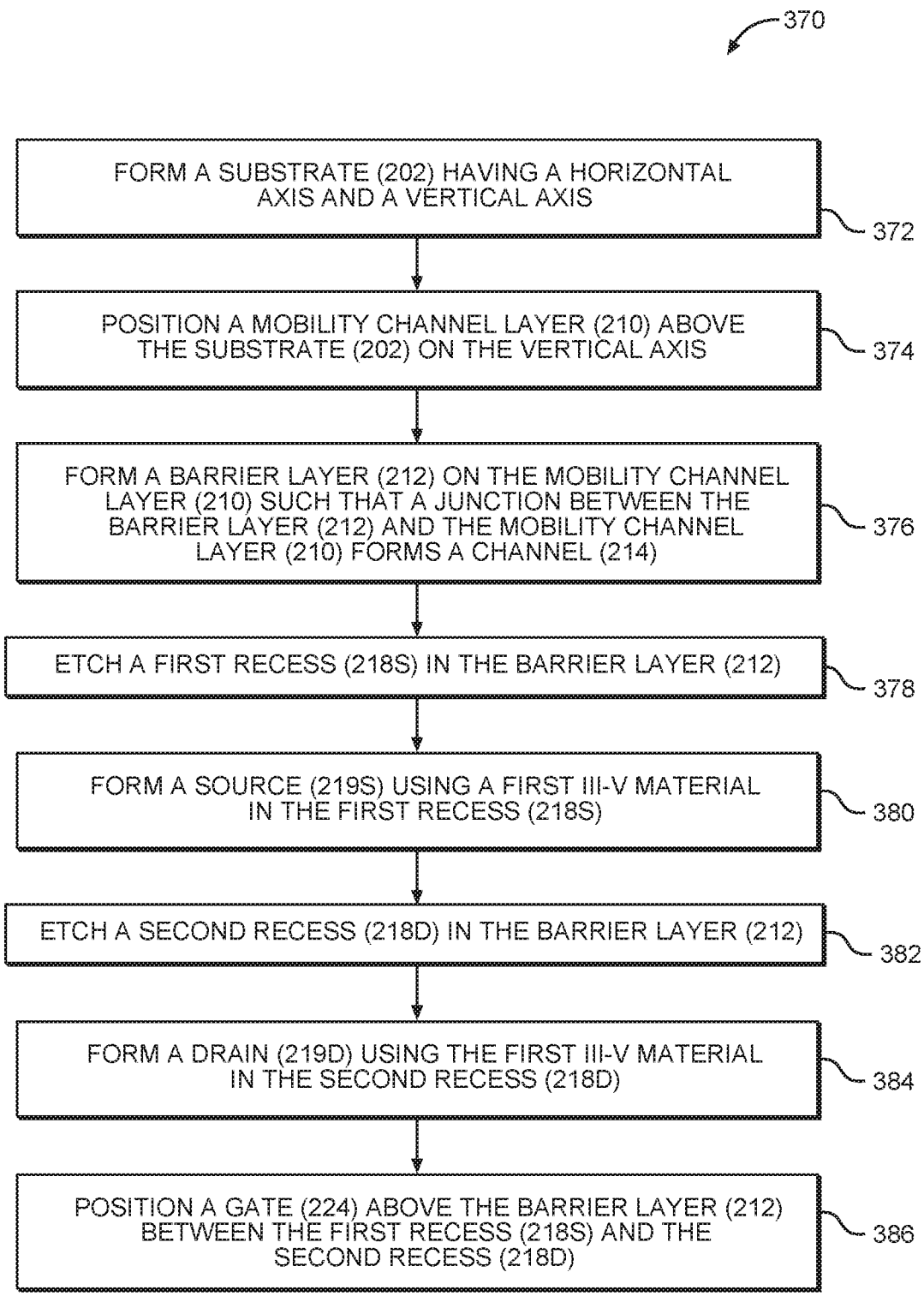
FIG. 3C provides a high-level summary of the flowcharts of FIGS. 3A and 3B.
Figure 4D:
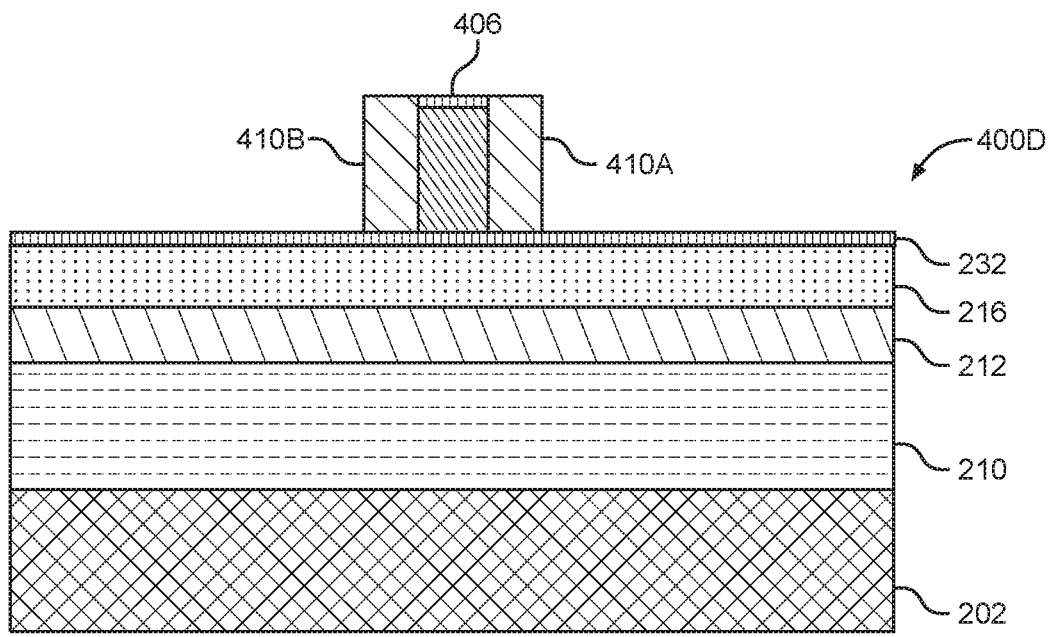

With continued reference to FIG. 3 and also to the partial product 400D of FIG. 4D, spacers 410A and 410B may be formed on either side of the dummy gate 406 (block 318). Note that the spacers 410A and 410B are equivalent to the spacers 230 above, but are separately numerated to assist in the explanation of the process 300. The spacers may be Silicon Nitride (SiN), Silicon Dioxide ($SiO_2$), Silicon Oxycarbonitride (SiCNO), or a similar material and may be between 1 nm and 20 nm wide. The width 408 of the dummy gate 406 plus the width of the two spacers 410A and 410B more closely corresponds to the channel length Lg.

Figure 4E:
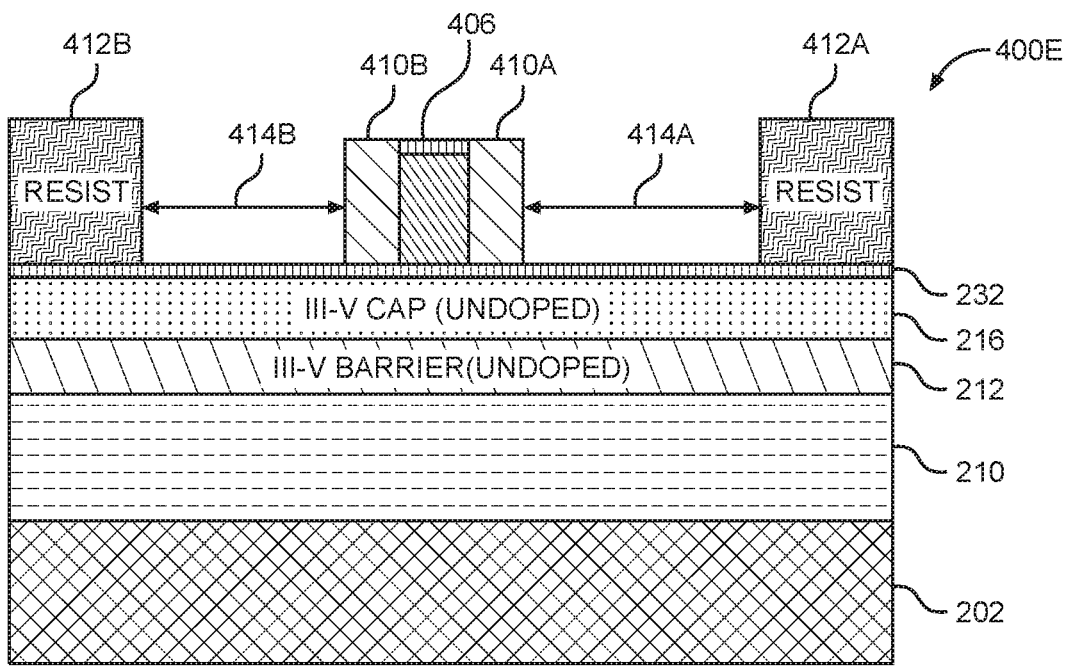

With continued reference to FIG. 3A and also to the partial product 400E of FIG. 4E, resist elements 412A and 412B are added on top of the first dielectric layer 232 (block 320). The resist elements 412A and 412B may be photoresists and may be approximately 0.2-2 µm tall and may define a width 414A between the resist element 412A and the spacer 410A and a second width 414B between the resist element 412B and the spacer 410B. The widths 414A and 414B may, in an exemplary aspect, be the same, and may correspond to an eventual width of a source and a drain. The resist elements 412A and 412B may be formed through a lithographic process or the like.

Figure 4F:
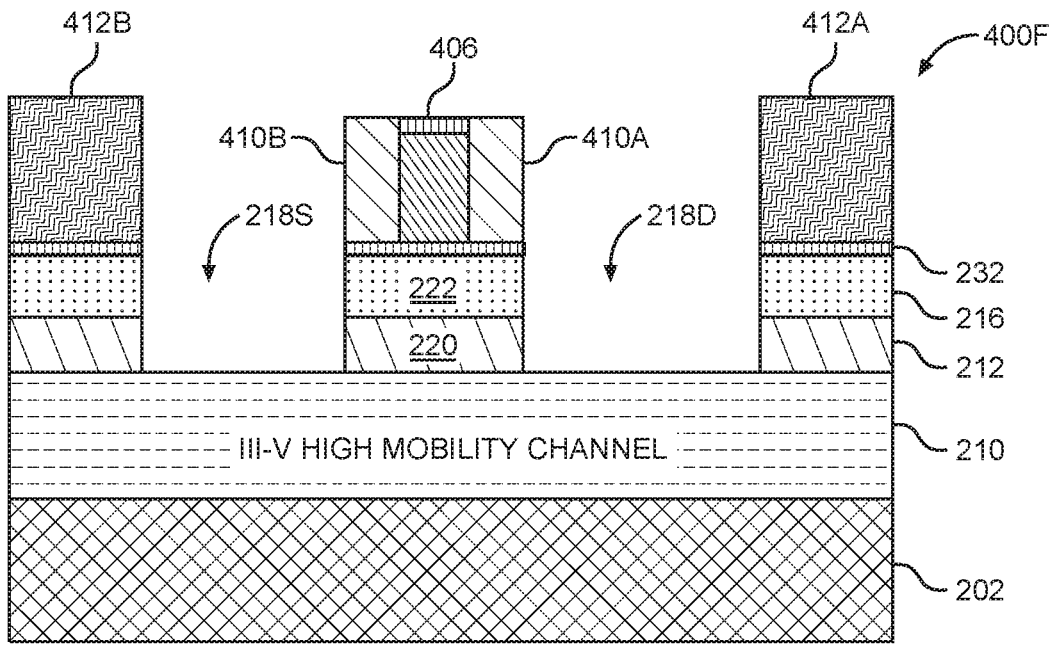

With continued reference to FIG. 3A and also to the partial product 400F of FIG. 4F, the process 300 continues by etching recesses 218S and 218D through the first dielectric layer 232, the cap layer 216, and the barrier layer 212 (block 322). The etchant may be chosen to have an etch selectivity which stops at the mobility channel layer 210. In an exemplary aspect, the dielectric material of the second dielectric layer 404 is different than the material of the first dielectric layer 232, and the etchant may be chosen to etch the first dielectric layer 232 without etching the material of the second dielectric layer 404. While not shown in the partial product 400F, the resist elements 412A and 412B are removed (block 324).

Figure 4G:
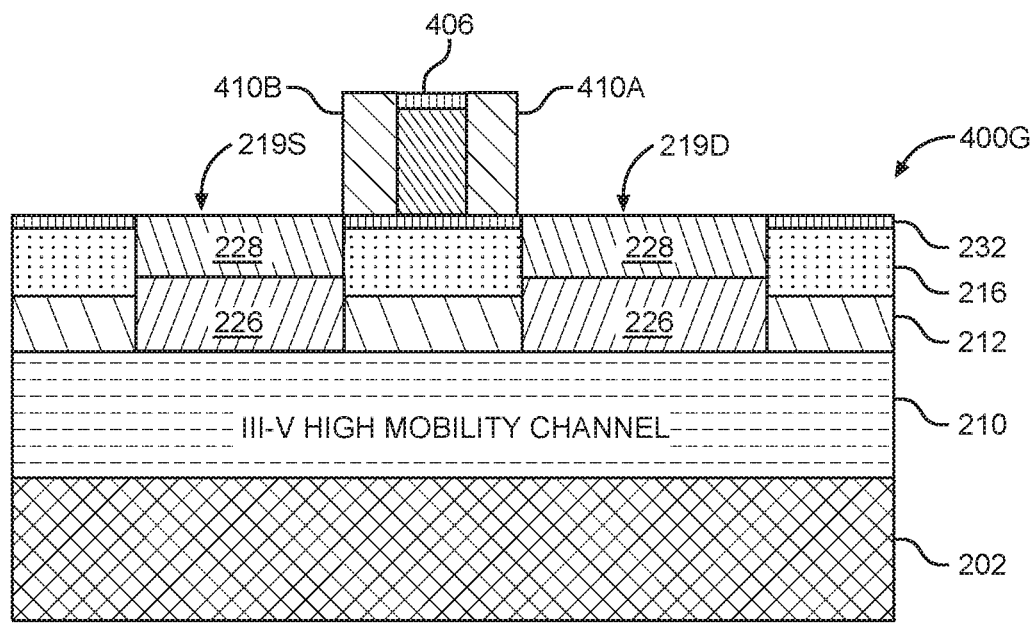

With continued reference to FIG. 3A and also to the partial product 400G of FIG. 4G, the process continues by epitaxially growing a source 219S and a drain 219D (block 326). It should be appreciated that epitaxial growth occurs selectively. On a semiconductor material, such as the material of the mobility channel layer 210, epitaxial growth will occur. In contrast, no net growth occurs on a dielectric material, such as the first dielectric layer 232 or the second dielectric layer 404. Thus, the epitaxial growth will occur only in the recesses 218S and 218D. Note that the growth on the first dielectric layer 232 may be removed through an etching process that may occur subsequent to the growth or substantially concurrently with the growth. The differences in growth rates allow the concurrent processes to occur. In an exemplary aspect, the source 219S and the drain 219D are formed from a plurality of layers 226 and 228. The bottom layer 226 may have a lattice that matches the mobility channel layer 210 (e.g., a heavily N+ doped Gallium Nitride (GaN) material) and may be between 10 Å and 100 Å, which may match the thickness of the barrier layer 212. Conversely, the top layer 228 may have a gradient composition to reduce resistance (e.g., a gradient of heavily N+ doped Indium Gallium Nitride (InGaN)) and may be between 10 Å and 200 Å, which may match the thickness of the cap layer 216. By changing the material of the source 219S and the drain 219D in this fashion, the overall resistance of the source 219S and the drain 219D are lowered, and the operating frequency may be raised by further lowering the length of the channel. However, the transistor 200 still must be finished.

Figure 4H:
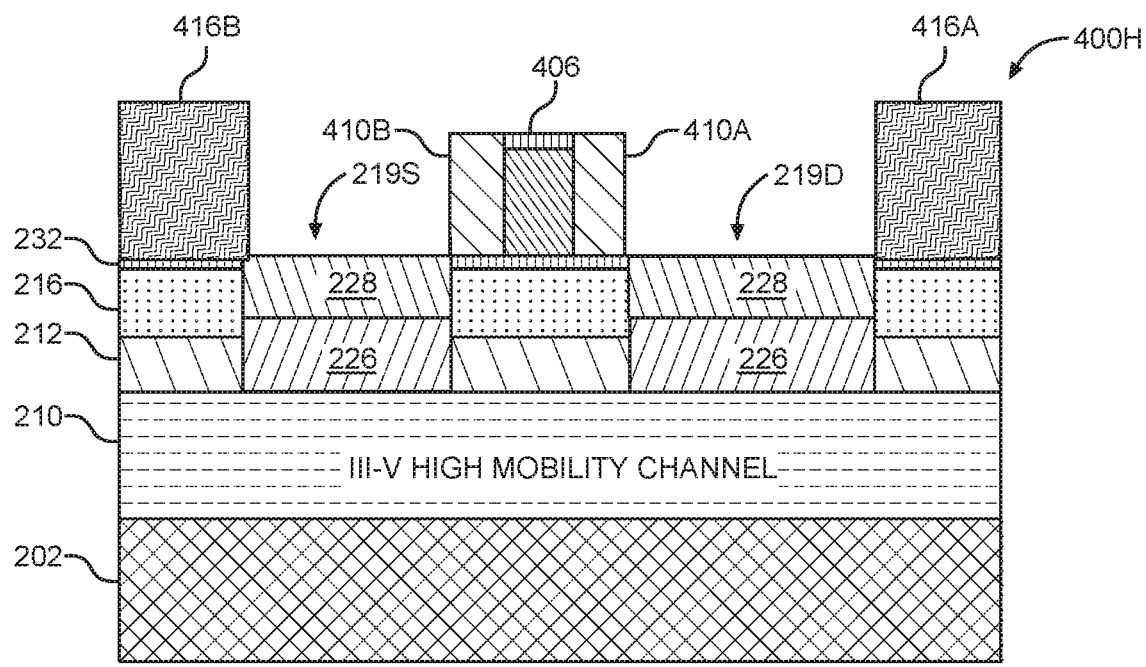

Thus, with continued reference to FIG. 3A and the partial product 400H of FIG. 4H, the process 300 continues by forming resists 416A and 416B over the remaining exposed portions of the first dielectric layer 232 (block 328) to facilitate formation of the contacts as explained below. The resists 416A and 416B may be formed through a lithographic process or the like.

Figure 4I:
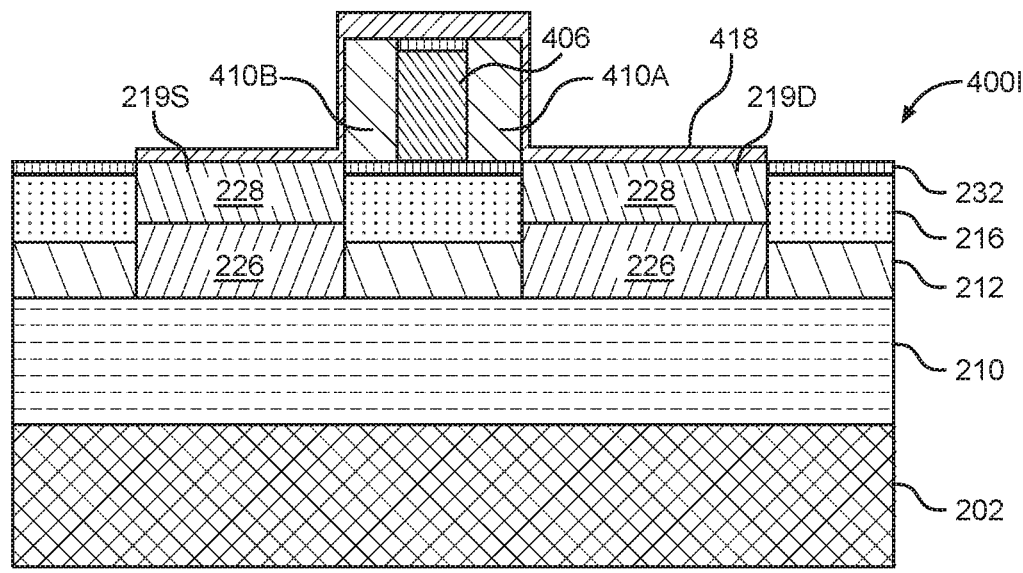

With continued reference to FIG. 3A and the partial product 400I of FIG. 4I, the process 300 continues by depositing a contact metal 418 in the space between the resists 416A and 416B and thus over the top layer 228 of the source 219S and the drain 219D (block 330). The contact metal 418 may be made from a suitable metal such as Titanium (Ti), Aluminum (Al), or Gold (Au) and may be approximately 20 nm thick. With reference to FIG. 3B, after the contact metal 418 is placed, the resists 416A and 416B may be removed (block 332).

Figure 4J:
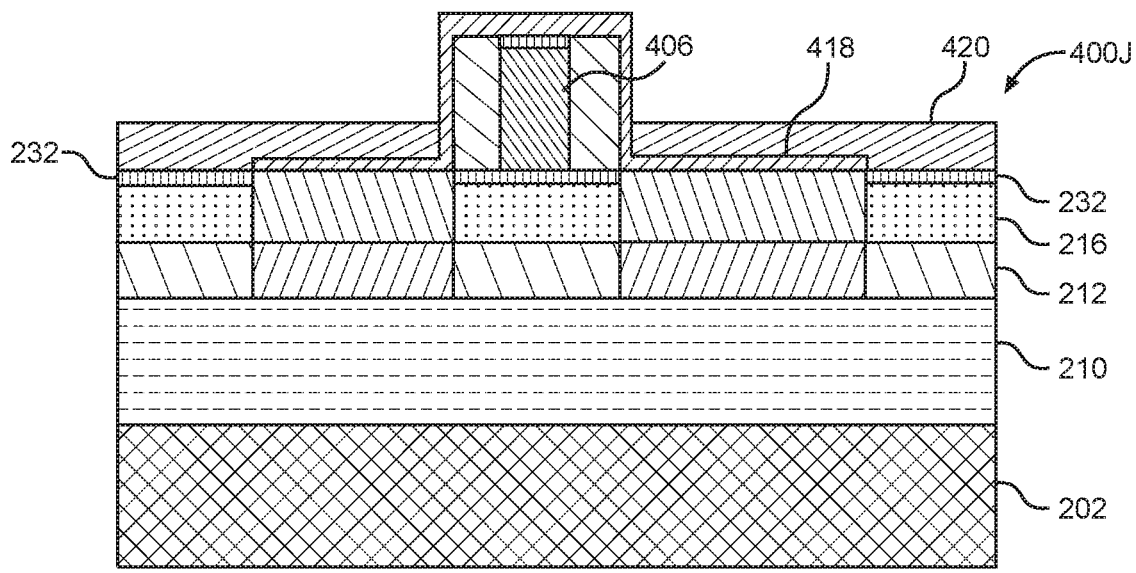

With continued reference to FIG. 3B and the partial product 400J of FIG. 4J, an oxide layer 420 is formed over the contact metal 418 (block 334). The oxide layer 420 may be formed through a spin-on process (which acts as a planarizing process) and be made from a Silicon Dioxide ($SiO_2$) material and may be approximately 10 nm thick.

Figure 4K:
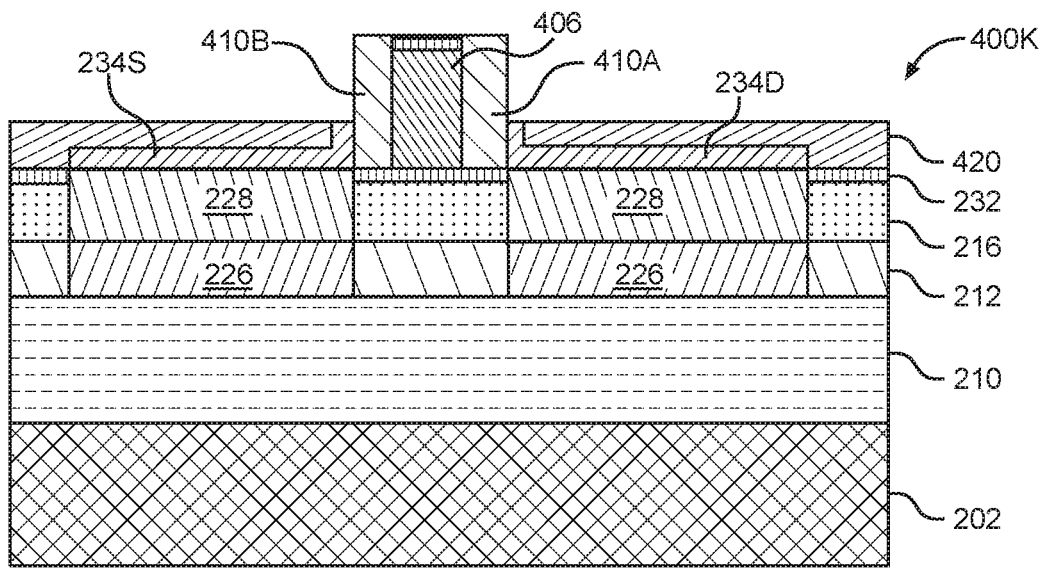

With continued reference to FIG. 3B and the partial product 400K of FIG. 4K, the contact metal 418 is etched to expose the dummy gate 406 and the spacers 410A and 410B (block 336). This cuts the contact metal 418 into the source contact 234S and the drain contact 234D. After etching, the source 219S and the drain 219D are subjected to ohmic annealing at approximately 800° C. (block 338). The annealing causes the metal of the contact metal 418 to react with the top layer 228 of the source 219S and the drain 219D to form a low resistance path.

Figure 4L:
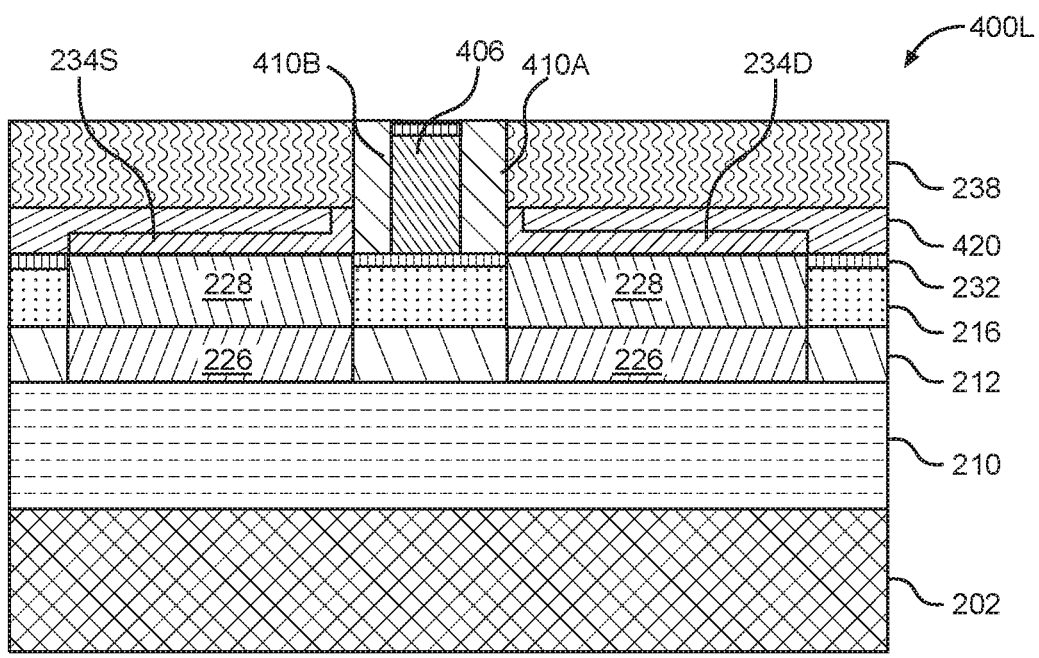

With continued reference to FIG. 3B and the partial product 400L of FIG. 4L, an additional dielectric layer 238 is deposited (block 340) and subjected to a chemical mechanical polish (CMP) planarization (block 342). This CMP step will remove the last vestiges of the second dielectric layer 404 (block 344). The CMP step may also be used to control the gate height as needed or desired. The dielectric layer 238 may be an oxide or Silicon Nitride (SiN), Silicon Oxycarbonitride (SiCNO), or the like and may be approximately 0.5-2 µm thick.

Figure 4M:
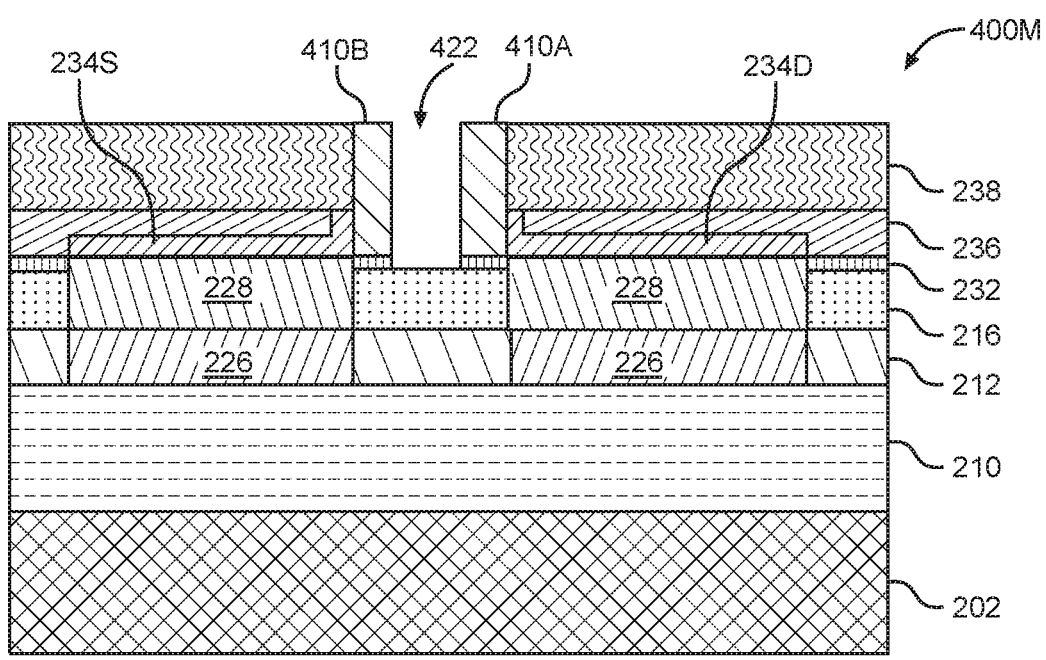

With continued reference to FIG. 3B and the partial product 400M of FIG. 4M, the dummy gate 406 is removed along with the portion of the first dielectric layer 232 that is under the dummy gate 406 (block 346). This removal may be done with a wet etch process that stops on the cap layer 216. This removal leaves a void or recess 422 present over the cap layer 216.

Figure 4N:
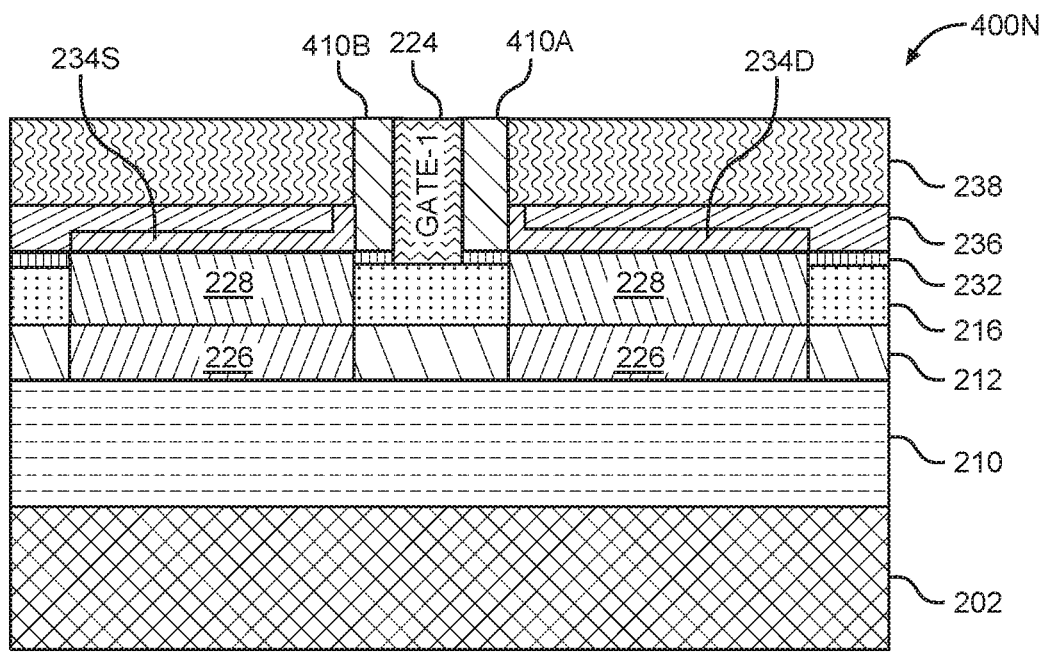

With continued reference to FIG. 3B and the partial product 400N of FIG. 4N, the recess 422 is filled with a gate material to form a gate 224 (block 348). The gate material may be a metal such as Nickel (Ni), Titanium (Ti), Aluminum (Al), Titanium Nitride (TiN), Tungsten (W), or the like and may be approximately 0.5 µm thick. Note that forming the gate 224 may be done with a deposition process and may result in metal being placed on top of the first dielectric layer 232. Such excess metal may be removed through a CMP step (not illustrated).

Figure 4O:
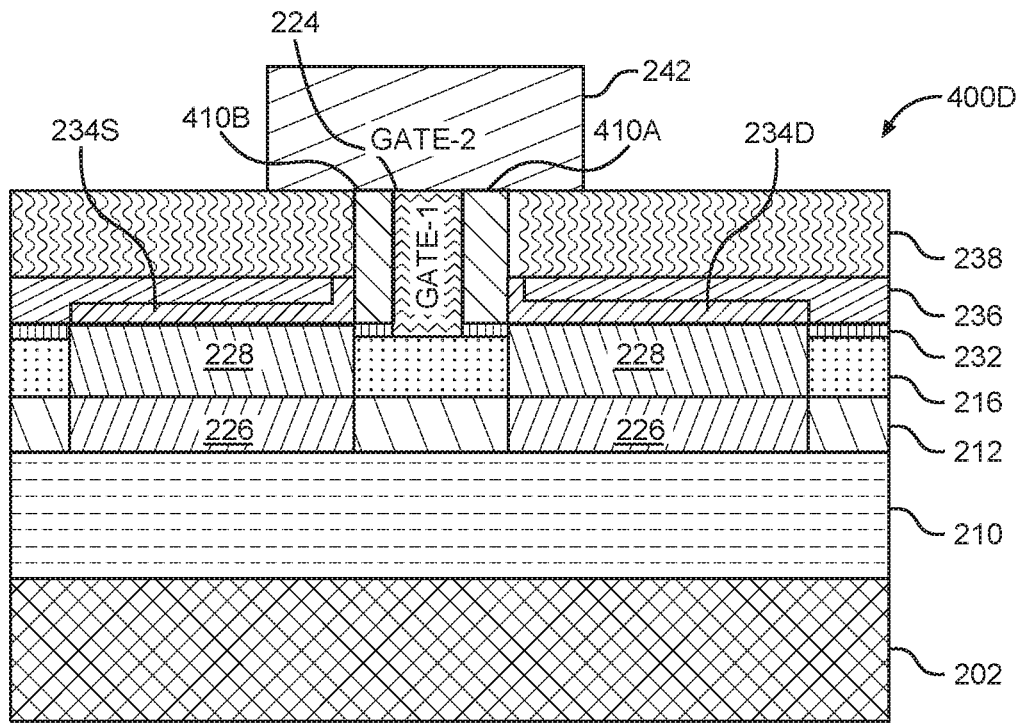

With continued reference to FIG. 3B and the partial product 400O of FIG. 4O, the process 300 continues by forming a T-gate or gamma-gate generically gate 242—over the gate 224 (block 350). The gate 242 may be made from a metal such as Tungsten (W), Aluminum (Al), Gold (Au), or the like and may be between 0.5 μm and 2 μm thick. The gate 242 may be made through a lithographic process or the like. T-gate is the term used if the gate 242 is symmetrically disposed above the gate 224. Gama-gate is the term used if the gate 242 is laterally shifted (in the x-direction) above the gate 224. III-V devices generally use gamma-gates, which are usually shifted towards the drain. Shifting the gamma-gate towards the drain has benefits for controlling the breakdown voltage of the drain. This allows for higher power capabilities.

Figure 4P:
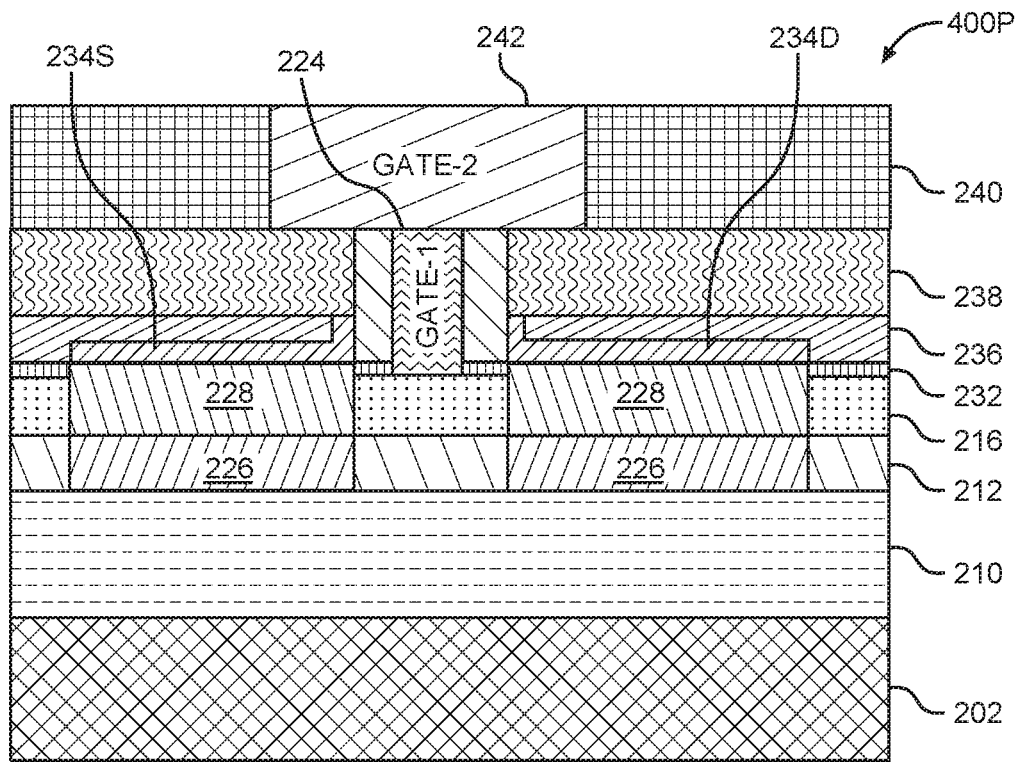

With continued reference to FIG. 3B and the partial product 400P of FIG. 4P, the process 300 continues by depositing a further dielectric layer 240 over the dielectric layer 238 (block 352) and performing a CMP (block 354). The dielectric layer 240 may be an oxide or Silicon Nitride (SiN), Silicon Oxycarbonitride (SiCNO), or the like and may be the same height as the T-gate 242 (i.e., 0.5-2 μm) thick.

Figure 4Q:
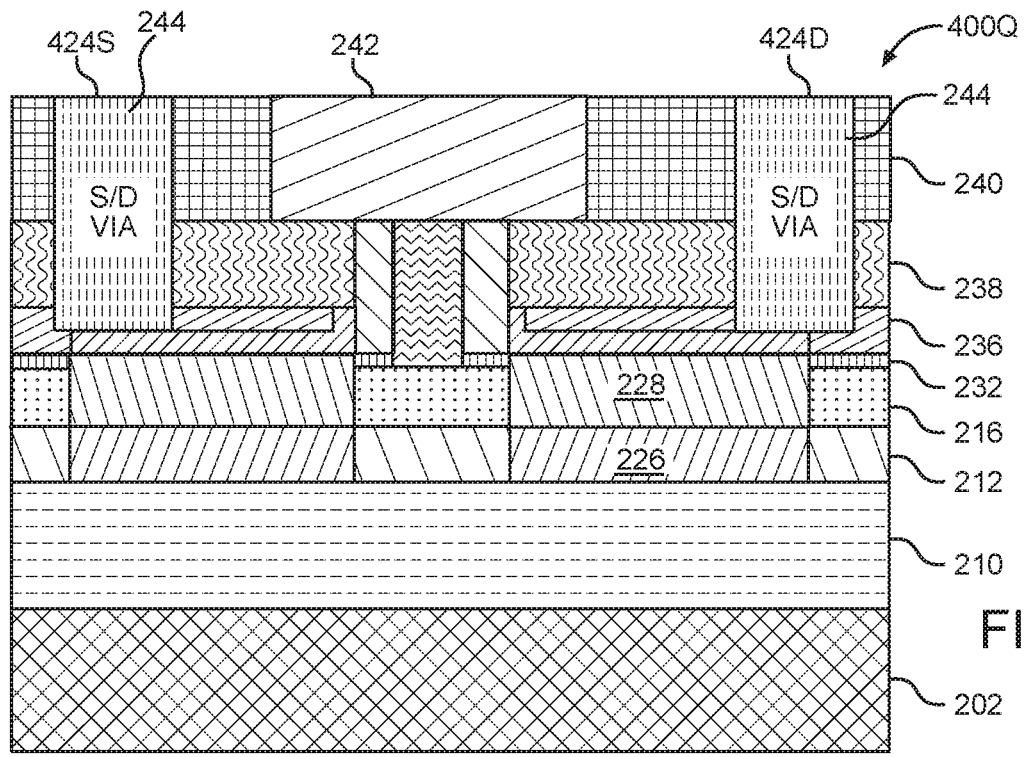

With continued reference to FIG. 3B and the partial product 400Q of FIG. 4Q, the process 300 continues by using a lithographic process to form via wells 424S and 424D over the source contact 234S and the drain contact 234D, respectively, and filling the via wells 424S and 424D with metal (block 356) to form source/drain vias 244.

Figure 4R:
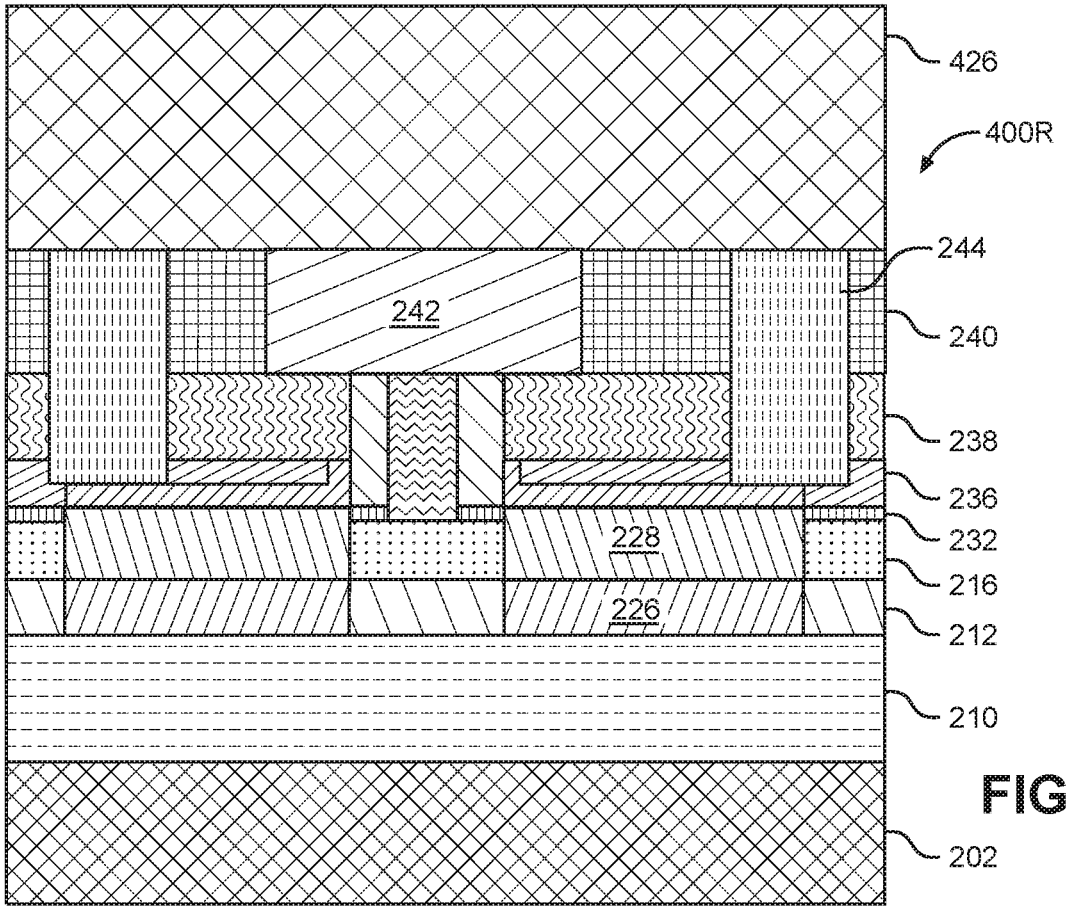
Figure 4S:
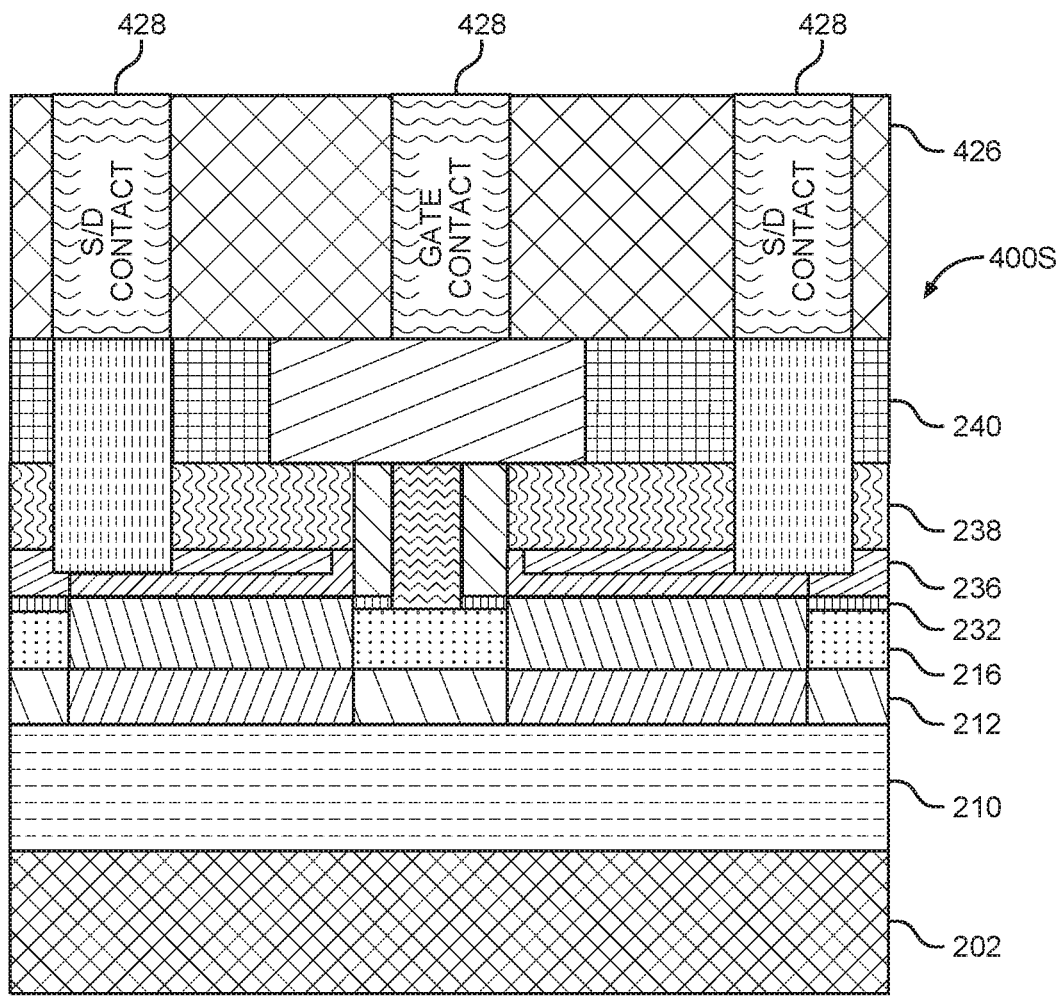

With continued reference to FIG. 3B and the partial product 400R of FIG. 4R, the process 300 continues by depositing another dielectric layer 426 over the source/drain vias 244, the gate 242, and the dielectric layer 240 (block 358). The dielectric layer 426 may be an oxide, Silicon Nitride (SiN), or Silicon Oxycarbonitride (SiCNO) and may be between 0.5 μm and 2 μm thick.

With continued reference to FIG. 3B and the finalized product 400S, which corresponds to the transistor 200 of FIG. 2A, metal contacts 428 are formed through the dielectric layer 426 (block 360). The metal contacts 428 may be formed through a lithographic and etching process or the like.

In summary, the process 300 may be shortened to a process 370 illustrated in FIG. 3C. The process 370 begins by forming a substrate 202 having a horizontal axis and a vertical axis (block 372). The process 370 continues by positioning a mobility channel layer 210 above the substrate 202 on the vertical axis (block 374) and forming a barrier layer 212 on the mobility channel layer 210 such that a junction between the barrier layer 212 and the mobility channel layer 210 forms a channel 214 (block 376). The process 370 continues by etching a first recess 218S in the barrier layer 212 (block 378) and forming a source 219S using a first III-V material in the first recess 218S (block 380). The process 370 continues by etching a second recess 218D in the barrier layer 212 (block 382) and forming a drain 219D using the first III-V material in the second recess 218D (block 384). Note that blocks 378 and 382 may occur simultaneously, and blocks 380 and 384 may likewise occur simultaneously. The process 370 concludes by positioning a gate 224 above the barrier layer 212 between the first recess 218S and the second recess 218D (block 386).

It should be appreciated that there may be other ways to do many particular steps (e.g., substituting deposition for epitaxially growing or vice versa; wet etching versus dry etching) without departing from the scope of the present disclosure. Nonetheless, by changing the material used for the source and the drain, exemplary aspects of the present disclosure reduce the resistance of the source and the drain to improve the operation of the transistor.

Figure 5:
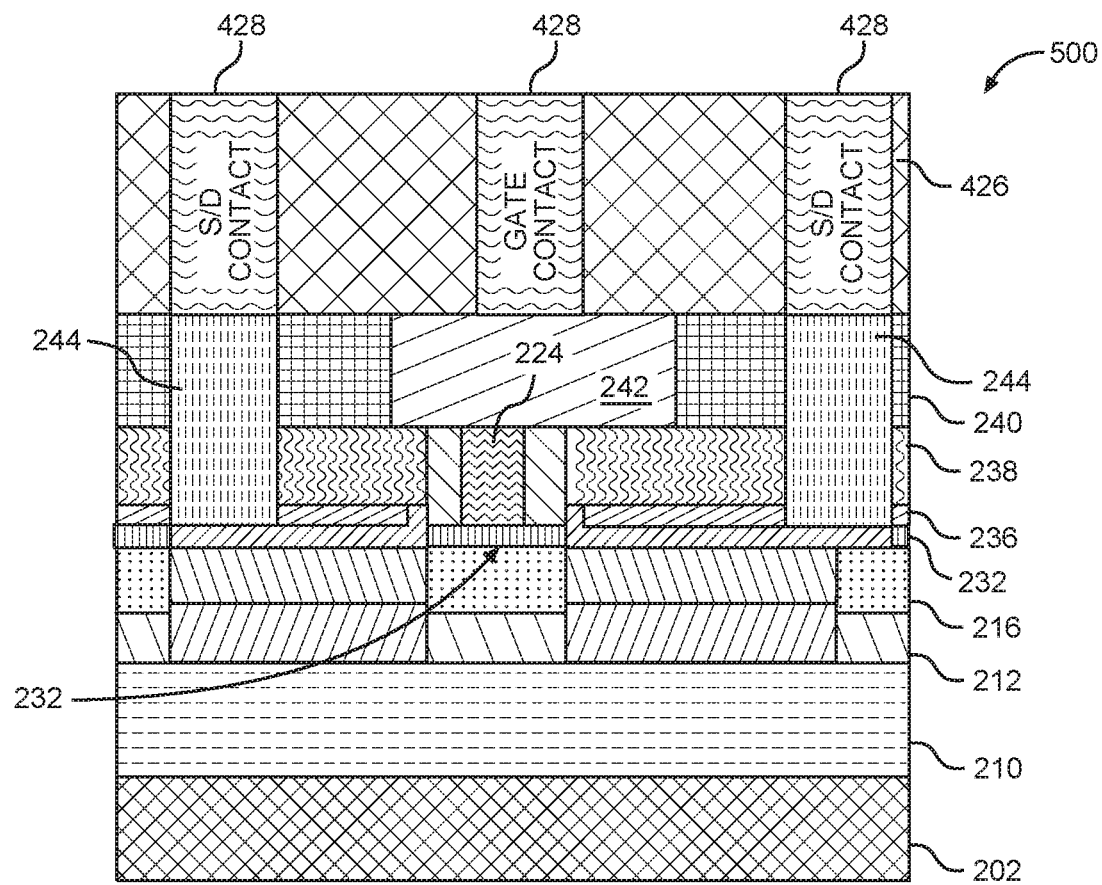
FIG. 5 is a cross-sectional elevational view of a metal oxide semiconductor (MOS) Field-Effect Transistor (FET) (MOSFET) having a reduced resistance source and drain according to a different aspect of the present disclosure.

While the above discussion is focused on a MESFET, it should be appreciated that the present disclosure is also applicable to a III-V MOSFET structure. FIG. 5 provides a cross-sectional elevational view of a MOSFET transistor 500 made according to an exemplary aspect of the present disclosure. The transistor 500 is similar to the transistor 200 of FIG. 2A, but the first dielectric layer 232 remains in place below the gate 224.

By keeping the first dielectric layer 232 under the gate 224, the gate metal is on an oxide and not on a semiconductor, and thus, instead of the Schottky junction of the MESFET, the transistor 500 has a metal-oxide semiconductor junction (i.e., a MOSFET). In all other respects, the transistor 500 is similar to the transistor 200 and that discussion is not repeated.

Figure 6:
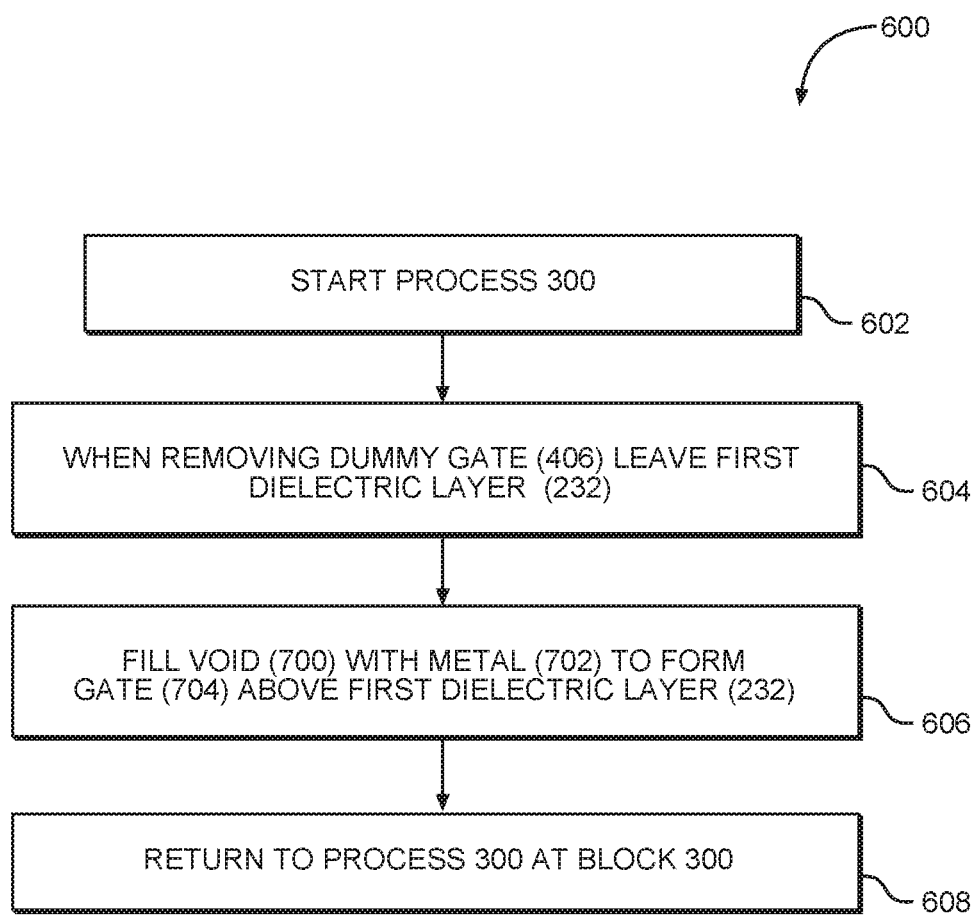
FIG. 6 is a flowchart illustrating an exemplary process for fabricating the MOSFET of FIG. 5.
Figure 7A:
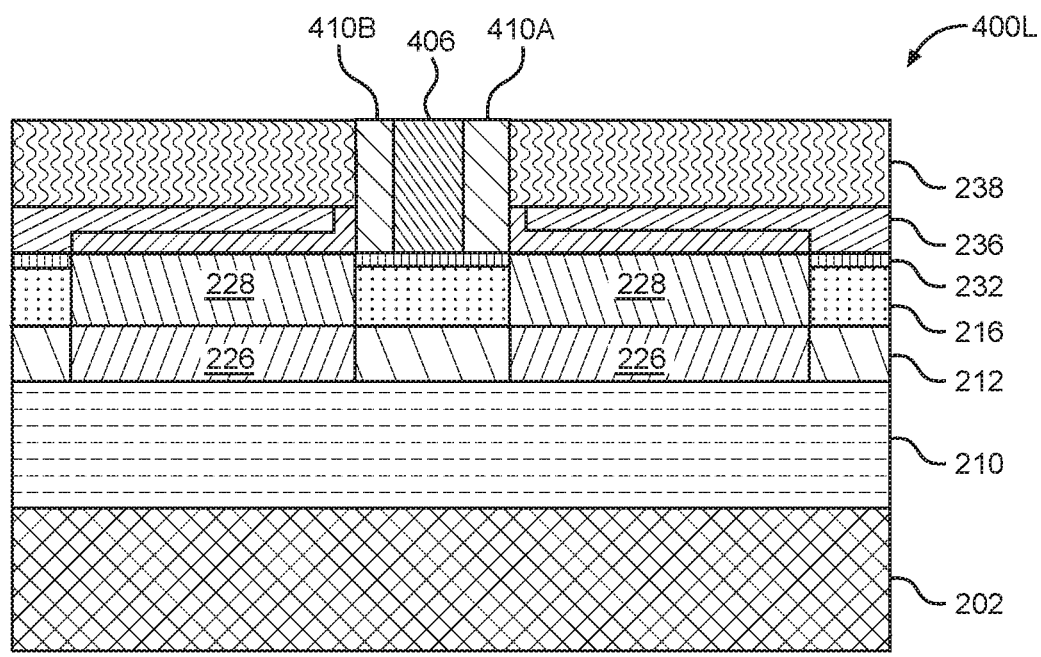
FIGS. 7A-7C are cross-sectional views of the fabrication steps of the process of FIG. 6 in fabricating the MOSFET of FIG. 5.
Figure 7B:
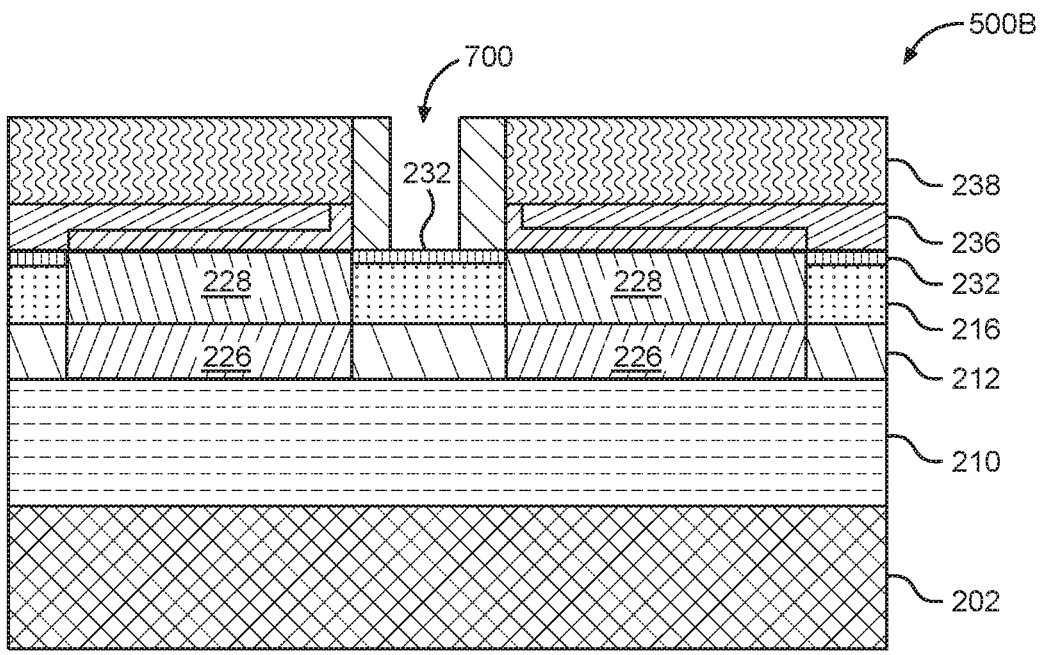
Figure 7C:
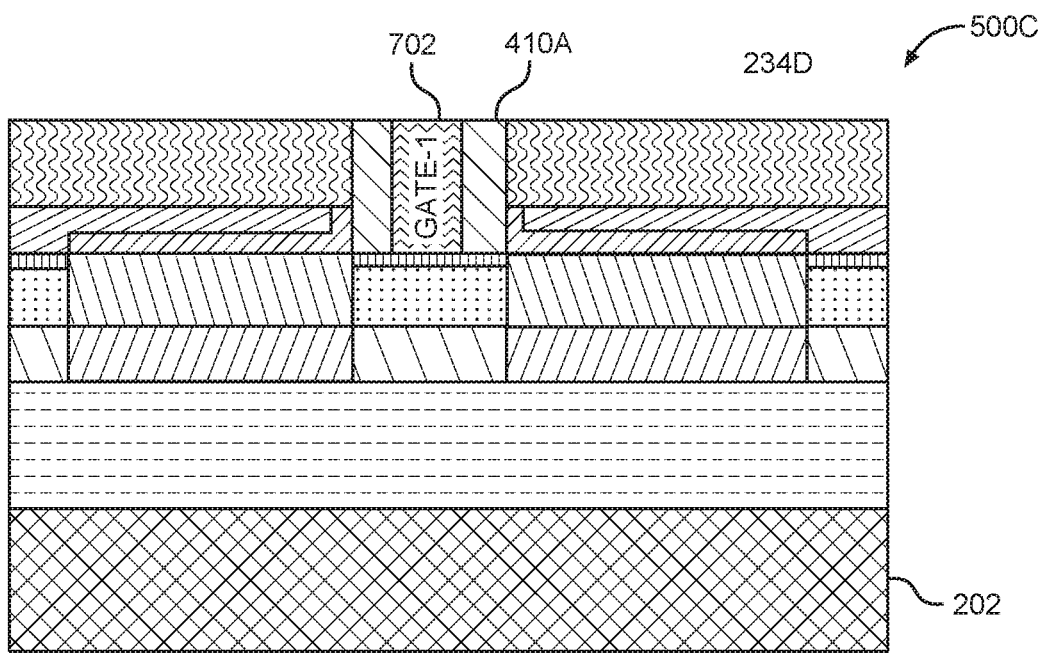

The formation of the transistor 500 is similar to the formation of the transistor 200 of FIG. 2A. However, to provide the interested reader with the salient difference, a flowchart of a process 600 is provided with reference to FIG. 6. The process 600 begins by starting the process 300 of FIGS. 3A and 3B (block 602). However, after block 344 the process 600 differs. After block 344, the process 300 has produced the partial product 400L (see FIG. 7A). Then, when removing the dummy gate 406, the process 600 leaves the first dielectric layer 232 (block 604, see partial product 500B in FIG. 7B). Then the process 600 fills a void 700 (FIG. 7B) with a metal 702 above the first dielectric layer 232 to form a gate 704 (block 606, see partial product 500C in FIG. 7C). The process 600 continues by return to block 350 of the process 300 (block 608).

The low resistance source/drain regions in III-V transistors according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
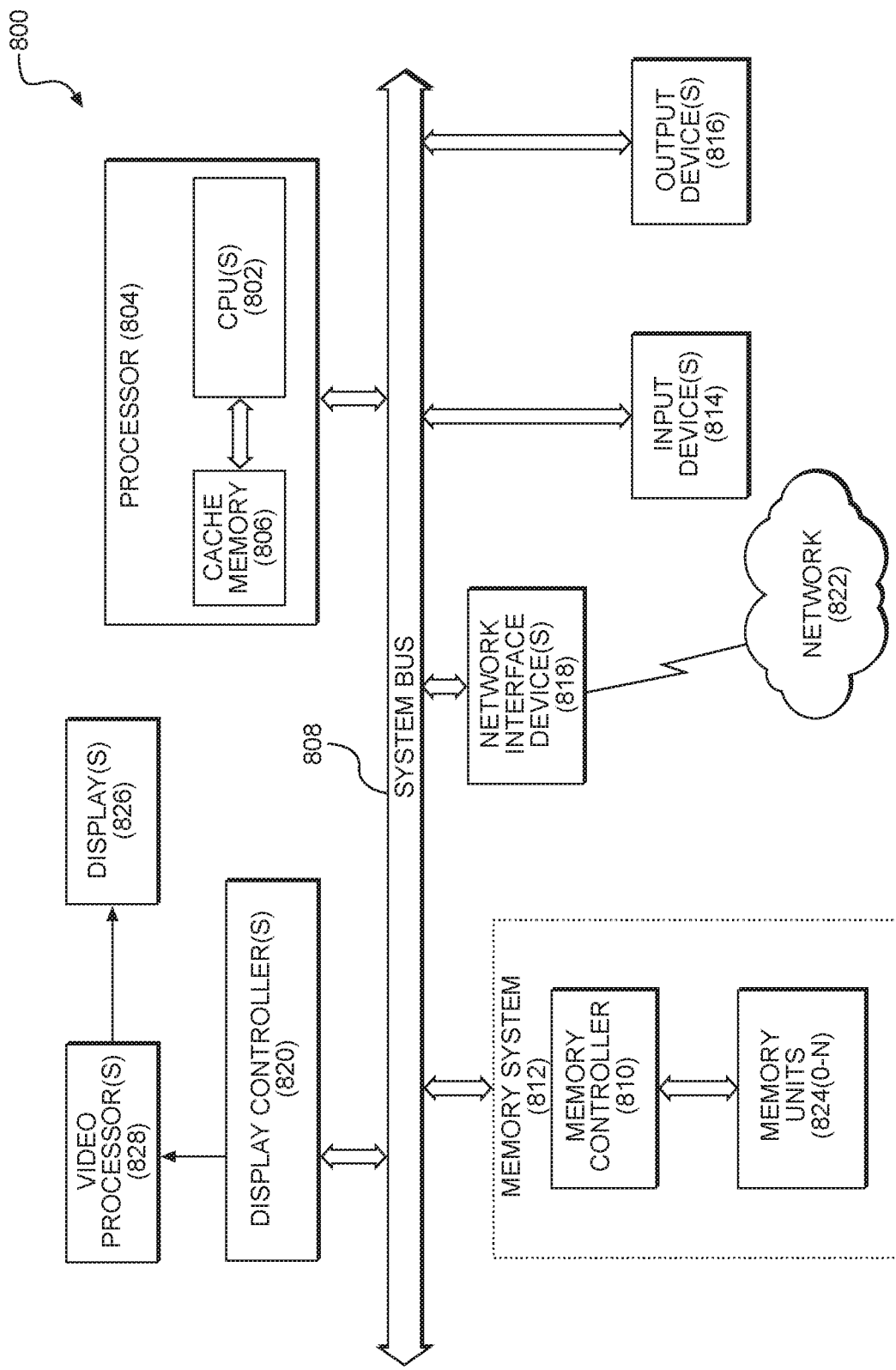
FIG. 8 is a block diagram of an exemplary processor-based system that can include the HEMT of FIG. 2A or the MOSFET of FIG. 5 in one or more logical elements or circuits.

In this regard, FIG. 8 illustrates an example of a processor-based system 800 that can employ the transistor 200 or the transistor 500 illustrated in FIGS. 2A and 5, respectively. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 808 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any devices configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(0-N).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Figure 9:
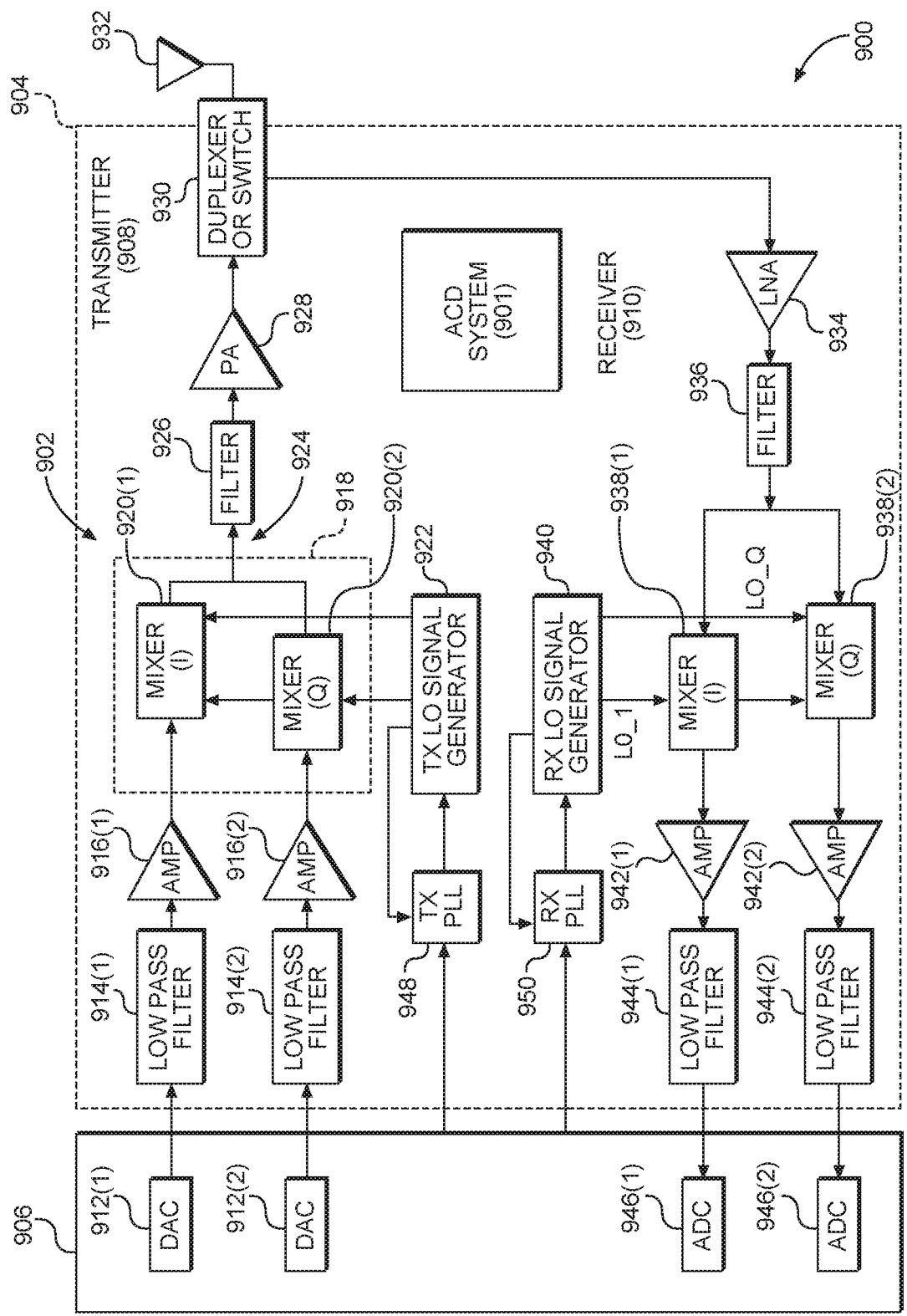
FIG. 9 is a simplified block diagram of a transceiver that may utilize the HEMT of FIG. 2A or the MOSFET of FIG. 5 in one or more logical elements or circuits.

FIG. 9 illustrates an exemplary wireless communications device 900 that can employ the transistor 200 or the transistor 500 illustrated in FIGS. 2A and 5, respectively. In this regard, the wireless communications device 900 may be provided in an integrated circuit (IC) 902. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1) and 912(2) for converting digital signals generated by the data processor 906 into the I and Q analog output signals, e.g., I and Q output currents, for further processing.

Within the transmitter 908, low pass filters 914(1) and 914(2) filter the I and Q analog output signals, respectively, to remove undesired signals caused by the prior digital-to-analog conversion. Amplifiers (AMPs) 916(1) and 916(2) amplify the signals from the low pass filters 914(1) and 914(2), respectively, and provide I and Q baseband signals. An upconverter 918 upconverts the I and Q baseband signals with I and Q transmit (TX) local oscillator (LO) signals through mixers 920(1) and 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmitted RF signal. The transmitted RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1) and 938(2) mix the output of the filter 936 with I and Q RX LO signals (i.e., LO_I and LO_Q) from an RX LO signal generator 940 to generate I and Q baseband signals. The I and Q baseband signals are amplified by amplifiers (AMPs) 942(1) and 942(2) and further filtered by low pass filters 944(1) and 944(2) to obtain I and Q analog input signals, which are provided to the data processor 906. In this example, the data processor 906 includes ADCs 946(1) and 2346(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL, circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A transistor comprising:
a substrate having a horizontal axis and a vertical axis;
a mobility channel layer comprising a first III-V material, the mobility channel layer positioned above the substrate on the vertical axis;
a barrier layer positioned above the mobility channel layer on the vertical axis, the barrier layer comprising a barrier structure, the barrier structure comprising a first side and a second side, the second side facing opposite the first side along the horizontal axis, a shared junction between the barrier layer and the mobility channel layer forming a channel;
a source positioned horizontally adjacent to the first side of the barrier structure, the source comprising:
a source bottom layer comprising the first III-V material; and
a source top layer comprising a second III-V material vertically adjacent the source bottom layer, wherein the second III-V material of the source top layer is heavily doped relative to the first III-V material of the source bottom layer;
a drain positioned horizontally adjacent to the second side of the barrier structure, the drain comprising:
a drain bottom layer comprising the first III-V material; and
a drain top layer comprising the second III-V material vertically adjacent the drain bottom layer, wherein the second III-V material of the drain top layer is heavily doped relative to the first III-V material of the drain bottom layer; and
a gate positioned above the barrier structure.

2. The transistor of claim 1, wherein the first III-V material comprises an undoped Gallium Nitride (GaN) material.

3. The transistor of claim 1, wherein the transistor comprises one of a high electron mobility transistor (HEMT), a pseudomorphic HEMT (pHEMT), or a metamorphic HEMT (mHEMT).

4. The transistor of claim 1 integrated into an integrated circuit.

5. The transistor of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

6. The transistor of claim 1, further comprising a cap layer positioned between the gate and the barrier layer.

7. The transistor of claim 6, further comprising a dielectric layer positioned above the cap layer.

8. The transistor of claim 1, further comprising a source contact positioned above the source.

9. The transistor of claim 8, further comprising a source via positioned above the source contact.

10. A transistor comprising:
a substrate having a horizontal axis and a vertical axis;

means for providing a channel, the means for providing the channel comprising at least a barrier structure positioned above the substrate on the vertical axis;

the barrier structure comprising a first side and a second side, the second side facing opposite the first side along the horizontal axis;

a source positioned horizontally adjacent to the first side of the barrier structure, the source comprising:
- a source bottom layer comprising a first III-V material; and
- a source top layer comprising a second III-V material vertically adjacent the source bottom layer, wherein the second III-V material of the source top layer is heavily doped relative to the first III-V material of the source bottom layer;

a drain positioned horizontally adjacent to the second side of the barrier structure, the drain comprising:
- a drain bottom layer comprising the first III-V material; and
- a drain top layer comprising the second III-V material vertically adjacent the drain bottom layer, wherein the second III-V material of the drain top layer is heavily doped relative to the first III-V material of the drain bottom layer; and a gate positioned above the barrier structure.

\* \* \* \* \*